(12) United States Patent
Parks et al.

(10) Patent No.: US 10,183,396 B2
(45) Date of Patent: Jan. 22, 2019

(54) MASS TRANSFER TOOL MANIPULATOR ASSEMBLY WITH REMOTE CENTER OF COMPLIANCE

(71) Applicant: Apple Inc., Cupertino, CA (US)

(72) Inventors: Paul Argus Parks, Austin, TX (US); Nile Alexander Light, Livermore, CA (US); Stephen P. Bathurst, Lafayette, CA (US); John A. Higginson, Santa Clara, CA (US); Andreas Bibl, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/364,199

(22) Filed: Nov. 29, 2016

(65) Prior Publication Data

US 2017/0072559 A1 Mar. 16, 2017

Related U.S. Application Data

(63) Continuation of application No. 14/273,298, filed on May 8, 2014, now Pat. No. 9,522,468.

(51) Int. Cl.
*B25J 7/00* (2006.01)
*B25J 18/00* (2006.01)
*B25J 9/00* (2006.01)

(52) U.S. Cl.
CPC ............ *B25J 7/00* (2013.01); *B25J 9/0015* (2013.01); *B25J 18/007* (2013.01); *Y10T 74/20354* (2015.01)

(58) Field of Classification Search
CPC .... B25J 15/0616; B25J 15/00; B25J 15/0009; B25J 15/0052; B25J 18/007; B25J 7/00; B25J 9/0015; A47G 21/10; A01D 87/003; Y10T 74/20354; B25B 9/00; B66C 1/24; B66C 1/585
See application file for complete search history.

(56) References Cited

U.S. PATENT DOCUMENTS 3,717,743 A 2/1973 Costello
3,935,986 A 2/1976 Lattari et al.
(Continued)

FOREIGN PATENT DOCUMENTS

CN 2070151 U 1/1991
CN 101863024 A 10/2010
(Continued)

OTHER PUBLICATIONS

PCT International Search Report and Written Opinion for International Application No. PCT/US2015/025611, dated Jan. 13, 2016, 15 pages.
(Continued)

*Primary Examiner* — Stephen A Vu
(74) *Attorney, Agent, or Firm* — Jaffery Watson Mendonsa & Hamilton LLC

(57) ABSTRACT

Systems and methods for transferring a micro device or an array of micro devices to or from a substrate are disclosed. In an embodiment, a remote center robot allows on-the-fly alignment between a micro pick up array and a target substrate. The remote center robot may include a plurality of symmetric linkages that move independently and share a remote rotational center. In an embodiment, the remote rotational center may be positioned at a surface of the micro pick up array to prevent damage to the array of micro devices during transfer.

16 Claims, 21 Drawing Sheets

(56) References Cited

U.S. PATENT DOCUMENTS

| | | |
|---|---|---|
| 5,131,582 A | 7/1992 | Kaplan et al. |
| 5,378,926 A | 1/1995 | Chi et al. |
| 5,435,857 A | 7/1995 | Han et al. |
| 5,592,358 A | 1/1997 | Shamouilian et al. |
| 5,740,956 A | 4/1998 | Seo et al. |
| 5,794,839 A | 8/1998 | Kimura et al. |
| 5,839,187 A | 11/1998 | Sato et al. |
| 5,851,664 A | 12/1998 | Bennett et al. |
| 5,888,847 A | 3/1999 | Rostoker et al. |
| 5,903,428 A | 5/1999 | Grimard et al. |
| 5,996,218 A | 12/1999 | Shamouilian et al. |
| 6,071,795 A | 6/2000 | Cheung et al. |
| 6,080,650 A | 6/2000 | Edwards |
| 6,081,414 A | 6/2000 | Flanigan et al. |
| 6,335,263 B1 | 1/2002 | Cheung et al. |
| 6,403,985 B1 | 6/2002 | Fan et al. |
| 6,420,242 B1 | 7/2002 | Cheung et al. |
| 6,521,511 B1 | 2/2003 | Inoue et al. |
| 6,543,987 B2 | 4/2003 | Ehrat |
| 6,558,109 B2 | 5/2003 | Gibbel |
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,683,368 B1 | 1/2004 | Mostafazadeh |
| 6,786,390 B2 | 9/2004 | Yang et al. |
| 6,878,607 B2 | 4/2005 | Inoue et al. |
| 6,918,530 B2 | 7/2005 | Shinkai et al. |
| 7,033,842 B2 | 4/2006 | Haji et al. |
| 7,148,127 B2 | 12/2006 | Oohata et al. |
| 7,208,337 B2 | 4/2007 | Eisert et al. |
| 7,353,596 B2 | 4/2008 | Shida et al. |
| 7,358,158 B2 | 4/2008 | Aihara et al. |
| 7,395,607 B1 | 7/2008 | Broderick et al. |
| 7,439,549 B2 | 10/2008 | Marchl et al. |
| 7,585,703 B2 | 9/2009 | Matsumura et al. |
| 7,628,309 B1 | 12/2009 | Erikssen et al. |
| 7,701,112 B2 | 4/2010 | Choi et al. |
| 7,714,336 B2 | 5/2010 | Imai |
| 7,723,764 B2 | 5/2010 | Oohata et al. |
| 7,795,629 B2 | 9/2010 | Watanabe et al. |
| 7,797,820 B2 | 9/2010 | Shida et al. |
| 7,838,410 B2 | 11/2010 | Hirao et al. |
| 7,854,365 B2 | 12/2010 | Li et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,972,875 B2 | 7/2011 | Rogers et al. |
| 7,989,266 B2 | 8/2011 | Borthakur et al. |
| 7,999,454 B2 | 8/2011 | Winters et al. |
| 8,023,248 B2 | 9/2011 | Yonekura et al. |
| 8,076,670 B2 | 12/2011 | Slater et al. |
| 8,186,568 B2 | 5/2012 | Coronel et al. |
| 8,333,860 B1 | 12/2012 | Bibl et al. |
| 8,349,116 B1 | 1/2013 | Bibl et al. |
| 8,388,035 B2 | 3/2013 | Kamon |
| 8,419,338 B2 | 4/2013 | Konosu |
| 8,426,227 B1 | 4/2013 | Bibl et al. |
| 8,518,204 B2 | 8/2013 | Hu et al. |
| 8,714,903 B2 | 5/2014 | Feng |
| 8,720,298 B2 | 5/2014 | Lehmann |
| 2001/0029088 A1 | 10/2001 | Odajima et al. |
| 2002/0076848 A1 | 6/2002 | Spooner et al. |
| 2003/0010975 A1 | 1/2003 | Gibb et al. |
| 2003/0177633 A1 | 9/2003 | Haji et al. |
| 2004/0100164 A1 | 5/2004 | Murata et al. |
| 2004/0232439 A1 | 11/2004 | Gibb et al. |
| 2004/0266048 A1 | 12/2004 | Platt et al. |
| 2005/0224822 A1 | 10/2005 | Liu |
| 2005/0232728 A1 | 10/2005 | Rice et al. |
| 2006/0038291 A1 | 2/2006 | Chung et al. |
| 2006/0055035 A1 | 3/2006 | Lin et al. |
| 2006/0065905 A1 | 3/2006 | Eisert et al. |
| 2006/0157721 A1 | 7/2006 | Tran et al. |
| 2006/0160276 A1 | 7/2006 | Brown et al. |
| 2006/0214299 A1 | 9/2006 | Fairchild et al. |
| 2007/0048902 A1 | 3/2007 | Hiatt et al. |
| 2007/0166851 A1 | 7/2007 | Tran et al. |
| 2007/0194330 A1 | 8/2007 | Ibbetson et al. |
| 2008/0048206 A1 | 2/2008 | Lee et al. |
| 2008/0150134 A1 | 6/2008 | Shinkai et al. |
| 2008/0163481 A1 | 7/2008 | Shida et al. |
| 2008/0194054 A1 | 8/2008 | Lin et al. |
| 2008/0196237 A1 | 8/2008 | Shinya et al. |
| 2008/0205027 A1 | 8/2008 | Coronel et al. |
| 2008/0283190 A1 | 11/2008 | Papworth et al. |
| 2008/0283849 A1 | 11/2008 | Imai |
| 2008/0303038 A1 | 12/2008 | Grotsch et al. |
| 2009/0068774 A1 | 3/2009 | Slater et al. |
| 2009/0072382 A1 | 3/2009 | Guzek |
| 2009/0146303 A1 | 6/2009 | Kwon |
| 2009/0303713 A1 | 12/2009 | Chang et al. |
| 2009/0314991 A1 | 12/2009 | Cho et al. |
| 2010/0052004 A1 | 3/2010 | Slater et al. |
| 2010/0105172 A1 | 4/2010 | Li et al. |
| 2010/0123164 A1 | 5/2010 | Suehiro et al. |
| 2010/0176415 A1 | 7/2010 | Lee et al. |
| 2010/0188794 A1 | 7/2010 | Park et al. |
| 2010/0200884 A1 | 8/2010 | Lee et al. |
| 2010/0203659 A1 | 8/2010 | Akaike et al. |
| 2010/0203661 A1 | 8/2010 | Hodota |
| 2010/0213471 A1 | 8/2010 | Fukasawa et al. |
| 2010/0214777 A1 | 8/2010 | Suehiro et al. |
| 2010/0248484 A1 | 9/2010 | Bower et al. |
| 2010/0276726 A1 | 11/2010 | Cho et al. |
| 2011/0003410 A1 | 1/2011 | Tsay et al. |
| 2011/0049540 A1 | 3/2011 | Wang et al. |
| 2011/0132655 A1 | 6/2011 | Horiguchi et al. |
| 2011/0132656 A1 | 6/2011 | Horiguchi et al. |
| 2011/0143467 A1 | 6/2011 | Xiong et al. |
| 2011/0147760 A1 | 6/2011 | Ogihara et al. |
| 2011/0151602 A1 | 6/2011 | Speier |
| 2011/0159615 A1 | 6/2011 | Lai |
| 2011/0210357 A1 | 9/2011 | Kaiser et al. |
| 2011/0247446 A1 | 10/2011 | Namoun et al. |
| 2011/0291134 A1 | 12/2011 | Kang |
| 2011/0297914 A1 | 12/2011 | Zheng et al. |
| 2011/0312131 A1 | 12/2011 | Renavikar et al. |
| 2012/0018494 A1 | 1/2012 | Jang et al. |
| 2012/0064642 A1 | 3/2012 | Huang et al. |
| 2012/0134065 A1 | 5/2012 | Furuya et al. |
| 2013/0019996 A1 | 1/2013 | Routledge |
| 2013/0038416 A1 | 2/2013 | Arai et al. |
| 2013/0130440 A1 | 5/2013 | Hu et al. |
| 2013/0134591 A1 | 5/2013 | Sakamoto et al. |
| 2013/0161682 A1 | 6/2013 | Liang et al. |
| 2014/0071580 A1 | 3/2014 | Higginson et al. |

FOREIGN PATENT DOCUMENTS

| | | |
|---|---|---|
| CN | 105074899 A | 11/2015 |
| FR | 2 571 289 A1 | 4/1986 |
| JP | 07-060675 A | 3/1995 |
| JP | 11-142878 A | 5/1999 |
| JP | 2001-298072 A | 10/2001 |
| JP | 2001-353682 A | 12/2001 |
| JP | 2002-134822 A | 5/2002 |
| JP | 2002-164695 A | 6/2002 |
| JP | 2002-176291 A | 6/2002 |
| JP | 2002-240943 A | 8/2002 |
| JP | 2004-095944 A | 3/2004 |
| JP | 2008-200821 A | 9/2008 |
| JP | 2010-056458 A | 3/2010 |
| JP | 2010-161212 A | 7/2010 |
| JP | 2010-186829 A | 8/2010 |
| JP | 2011-181834 A | 9/2011 |
| KR | 10-0610632 B1 | 8/2006 |
| KR | 10-2007-0042214 A | 4/2007 |
| KR | 10-2007-0093091 A | 9/2007 |
| KR | 10-0973928 B1 | 8/2010 |
| KR | 10-1001454 B1 | 12/2010 |

(56) References Cited

FOREIGN PATENT DOCUMENTS

| KR | 10-2007-0006885 A | 1/2011 |
|---|---|---|
| KR | 10-2011-0084888 A | 7/2011 |
| WO | WO 2005-099310 A2 | 10/2005 |
| WO | WO 2011/123285 | 10/2011 |

OTHER PUBLICATIONS

PCT Invitation to Pay Additional Fees for International Application No. PCT/US2015/025611, dated Sep. 10, 2015, 5 pages.

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laborotory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. of ASID '06, Oct. 8-12, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Proceedings of CARTS Europe, Barcelona, Spain, 2007, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low-Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Performance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping for Next Generation Semiconductor Devices" Apr. 21, 1999, 4 pgs.

PCT Chapter I International Preliminary Report on Patentability (IPRP Chapter I) PCT/US2015/025611 dated Nov. 17, 2016. (10 Pages).

MASS TRANSFER TOOL MANIPULATOR ASSEMBLY WITH REMOTE CENTER OF COMPLIANCE

RELATED APPLICATIONS

This application is a continuation of co-pending U.S. patent application Ser. No. 14/273,298, filed on May 8, 2014, which is incorporated herein by reference.

BACKGROUND

Field

The present invention relates to systems and methods for transferring micro devices. More particularly, embodiments of the present invention relate to systems and methods for rotationally aligning an array of micro devices relative to a substrate.

Background Information

The feasibility of commercializing miniaturized devices such as radio frequency (RF) microelectromechanical systems (MEMS) microswitches, light-emitting diode (LED) display systems, and MEMS or quartz-based oscillators is largely constrained by the difficulties and costs associated with manufacturing those devices. Miniaturized device manufacturing processes typically include processes in which miniaturized devices are transferred from one wafer to another. In one such implementation, a transfer wafer may pick up an array of miniaturized devices from a donor wafer and bond the miniaturized devices to a receiving wafer.

Miniaturized device transfer requires accurate and repeatable alignment in six spatial degrees of freedom between the transfer wafer and target wafer during the pick-up and bonding processes. Furthermore, alignment between the transfer wafer and the target wafer may be required after making contact between the target wafer and the transfer wafer. Methods and apparatuses for aligning two flat surfaces in a parallel orientation have been described, and may be applied to the problem of miniaturized device transfer. However, using some of the described methods, the wafers, or miniaturized devices on the wafers, may be smeared and damaged if alignment occurs after making contact between the wafers. This smearing may be caused by parasitic lateral motion, which is lateral motion of a point on an object accompanying rotation of the object about a center of rotation. That is, unless the point coincides with the center of rotation, the point will experience some lateral motion relative to the center rotation as it effectively pivots about the center of rotation. Some systems, such as hexapod robots, hybrid split-axis stages with tripod robot, and six-jointed serial arm robots, may use real-time motion control to provide rotational alignment about a point at the intersection of two planar surfaces, with negligible parasitic motion. However, such systems have some combination of limitations that may include slow response, inadequate stiffness, high cost, and excessive size and/or space requirements.

SUMMARY OF THE DESCRIPTION

A remote center robot and methods of using the remote center robot to transfer an array of micro devices to or from a substrate are disclosed. In an embodiment, a remote center robot includes a first linkage and a second linkage. The first linkage may include a first upper joint and a first lower joint separated along a first axis by a first link arm having a first length. The second linkage may include a second upper joint and a second lower joint, wherein the second upper joint is fixed relative to the first lower joint, and wherein the second upper joint and the second lower joint are separated along a second axis by a second link arm having a second length equal to the first length.

In an embodiment, the first linkage and the second linkage are positioned orthogonal to each other. More particularly, the first upper joint may be coplanar with the first lower joint in a first plane, and the second upper joint may be coplanar with the second lower joint in a second plane orthogonal to the first plane.

In an embodiment, the first and second linkages of the remote center robot are symmetric in any of several manners. For example, the first plane and the second plane may intersect along a z-axis, and a first angle between the first axis and the z-axis may be equal to a second angle between the second axis and the z-axis. Alternatively, the first upper joint may be coplanar with the second upper joint in an upper plane orthogonal to the z-axis, and the first lower joint may be coplanar with the second lower joint in a lower plane orthogonal to the z-axis. In an embodiment, a first combined stiffness of the first linkage is equal to a second combined stiffness of the second linkage. For example, the upper joints and lower joints of the linkages may include a plurality of living hinges have a same combined stiffness.

In an embodiment, a linkage of a remote center robot is symmetric relative to itself. For example, the first linkage may include a third upper joint coplanar with a third lower joint in the first plane, such that the third upper joint and the third lower joint are separated along a third axis by a third link arm, and the third lower joint is coupled with the first lower joint by a first coupler link of the first linkage. In an embodiment, a third angle between the third axis and the z-axis is equal to the first angle. Furthermore, the third upper joint may be coplanar with the first upper joint in the upper plane.

In an embodiment, a remote center robot includes an adjustment mechanism to adjust a remote tipping center of a first linkage to align with a remote tilting center of a second linkage, thereby forming a remote rotational center. In an embodiment, the adjustment mechanism is associated with the first linkage and includes an adjuster link between the first upper joint and an adjustment joint. For example, the adjustment joint may be coupled with a first ground link of the first linkage. Furthermore, the adjuster link may be adjustable such that a lateral distance between the first upper joint and a z-axis changes when the adjuster link is adjusted. In an embodiment, the adjustment joint pivotally couples the adjuster link with the first ground link, such that the lateral distance changes when the adjuster link pivots about the adjustment joint. In another embodiment, the adjuster link includes a variable length, such that the lateral distance changes when the variable length changes.

In an embodiment, linkages of a remote center robot are moved by one or more actuators. For example, a first linear actuator may have a first end fixed relative to the first upper joint and a second end coupled with the first link arm, such that actuation of the first linear actuator changes the first angle. Furthermore, a second linear actuator may have a third end fixed relative to the second upper joint and a fourth end coupled with the second link arm, such that actuation of the second linear actuator changes the second angle.

In an embodiment, geometry of a first linkage and a second linkage of a remote center robot may form a remote rotational center. For example, the first axis may intersect the z-axis at a remote tipping center, the second axis may intersect the z-axis at a remote tilting center, and the remote tipping center may be coincident with the remote tilting center at a remote rotational center. In an embodiment, the remote center robot also includes a z-flexure having an upper portion coupled with a second coupler link of the second linkage and a lower portion separated from the upper portion along the z-axis. A distribution plate may be coupled with the lower portion of the z-flexure and configured to receive a micro pick up array having an electrostatic transfer head such that the remote rotational center is coincident with the electrostatic transfer head.

In an embodiment, a method includes providing a remote center robot along a z-axis. The remote center robot may include a first linkage coupled with a first actuator and a second linkage coupled with a second actuator. A first coupler link of the first linkage may be fixed relative to a second ground link of the second linkage. Furthermore, a remote tipping center of the first linkage may be coincident with a remote tilting center of the second linkage at a remote rotational center on the z-axis. The method may further include receiving a signal from at least one of a tip sensor or a tilt sensor on a micro pick up array mount that is coupled with a second coupler link of the second linkage. In response to the signal, at least one of the first actuator or the second actuator may be actuated to rotate at least one of the first coupler link or the second coupler link about the remote rotational center.

In an embodiment, the first linkage and the second linkage of the method include symmetric link arm lengths. For example, the first linkage may include a first upper joint and a first lower joint separated along a first axis by a first link arm having a first length. The second linkage may include a second upper joint and a second lower joint. Furthermore, the second upper joint may be fixed relative to the first lower joint, and the second upper joint and the second lower joint may be separated along a second axis by a second link arm having a second length equal to the first length.

In an embodiment, the first linkage and the second linkage of the method are positioned orthogonal to each other. More particularly, the first upper joint may be coplanar with the first lower joint in a first plane, and the second upper joint may be coplanar with the second lower joint in a second plane orthogonal to the first plane.

In an embodiment, the first linkage and second linkage of the method include at least one of several geometric symmetries. For example, the first plane and the second plane may intersect along the z-axis, and a first angle between the first axis and the z-axis may be equal to a second angle between the second axis and the z-axis. Alternatively, the first upper joint may be coplanar with the second upper joint in an upper plane orthogonal to the z-axis, and the first lower joint may be coplanar with the second lower joint in a lower plane orthogonal to the z-axis.

In an embodiment, the method further includes adjusting an adjuster link of the first linkage to align the remote tipping center with the remote tilting center at the remote rotational center. The adjuster link may be located between the first upper joint and an adjustment joint, and the adjustment joint may be coupled with a first ground link of the first linkage. Adjusting the adjuster link includes pivoting the adjuster link about the adjustment joint. Alternatively, adjusting the adjuster link may include changing a length of the adjuster link.

In an embodiment, the method includes moving the remote center robot along the z-axis. As a result, an array of electrostatic transfer heads on a micro pick up array coupled with the second coupler link may be simultaneously moved toward a substrate surface. Thus, actuating at least one of the first actuator or the second actuator may include aligning the array of electrostatic transfer heads with the substrate surface. In an embodiment, the remote rotational center is coincident with the array of electrostatic transfer heads.

DETAILED DESCRIPTION

Figure 1:
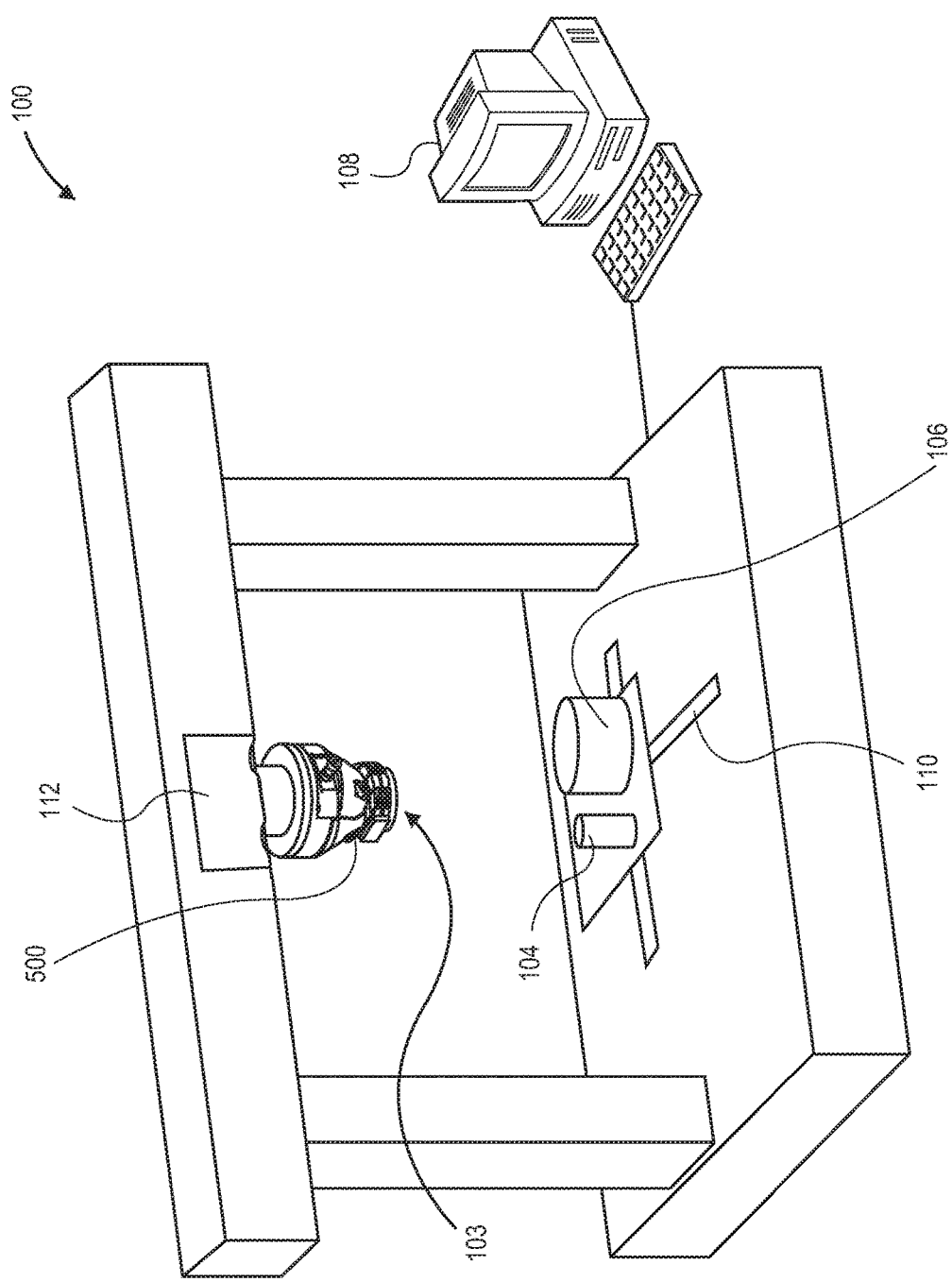
FIG. 1 is a perspective view of a mass transfer tool.

Embodiments of the present invention describe systems and methods for transferring a micro device or an array of micro devices to or from a substrate. For example, the micro devices or array of micro devices may be any of the micro LED device structures illustrated and described in related U.S. patent application Ser. Nos. 13/372,222, 13/436,260, 13/458,932, and 13/625,825. While some embodiments of the present invention are described with specific regard to micro LED devices, the embodiments of the invention are not so limited and certain embodiments may also be applicable to other micro LED devices and micro devices such as diodes, transistors, integrated circuit (IC) chips, MEMS, and bio-samples.

In various embodiments, description is made with reference to the figures. However, certain embodiments may be practiced without one or more of these specific details, or in combination with other known methods and configurations. In the following description, numerous specific details are set forth, such as specific configurations, dimensions, and processes, in order to provide a thorough understanding of the present invention. In other instances, well-known processes and manufacturing techniques have not been described in particular detail in order to not unnecessarily obscure the present invention. Reference throughout this specification to "one embodiment," "an embodiment", or the like, means that a particular feature, structure, configuration, or characteristic described in connection with the embodiment is included in at least one embodiment of the invention. Thus, the appearances of the phrase "one embodiment," "an embodiment", or the like, in various places throughout this specification are not necessarily referring to the same embodiment of the invention. Furthermore, the particular features, structures, configurations, or characteristics may be combined in any suitable manner in one or more embodiments.

The terms "over", "to", "between", and "on" as used herein may refer to a relative position of one layer or component with respect to other layers or components. One layer "over" or "on" another layer or bonded "to" another layer may be directly in contact with the other layer or may have one or more intervening layers. One layer "between" layers may be directly in contact with the layers or may have one or more intervening layers.

In an aspect, embodiments describe systems and methods for rotationally aligning a micro pick up array relative to a substrate. In an embodiment, the micro pick up array is carried by a remote center robot that manipulates an orientation of the micro pick up array. More particularly, the remote center robot may include a first linkage that moves independently of a second linkage and the micro pick up array may be coupled with the second linkage. In an embodiment, the first linkage carries the second linkage, but each linkage has an independent range of motion. For example, the first linkage may include a first coupler link that may tip without causing a second coupler link of the second linkage to move, and the second coupler link may tilt without causing the first coupler link to move. However, although motion of each coupler link may be independent from the other, each linkage may nonetheless share a common remote center of rotation. Furthermore, the common center of rotation may be located at a point of interest, such as at a surface of the micro pick up array. Thus, the surface of the micro pick up array may experience pure tipping about the common center of rotation when the first linkage tips and the micro pick up array may experience pure tilting about the common center of rotation when the second linkage tips. Therefore, when the surface of the micro pick up array contacts a substrate, the micro pick up array may be tipped and tilted to align the micro pick up array surface relative to the substrate without experiencing any parasitic translational motion that could damage the substrate or a micro device on the substrate. Adjustment of the micro pick up array may be dynamically controlled to adjust a magnitude and direction of a pressure gradient across the surface of the micro pick up array in addition to, or as a proxy for, micro pick up array alignment.

In an aspect, embodiments describe a remote center robot having symmetric first and second linkages. The linkages may share geometric symmetries. For example, link arms of both linkages may have equivalent lengths. Link arms may also be similarly oriented about a vertical axis, e.g., an angle between each link arm and the vertical axis may be the same. Similarly, an angle between link arms of the first linkage may be equal to an angle between link arms of the second linkage. The first and second linkages may also have symmetric geometries in that upper joints of all link arms may be coplanar within an upper plane and lower joints of all link arms may be coplanar within a lower plane. Furthermore, the linkages may share structural symmetries. For example, an overall stiffness of the first linkage may be the same as an overall stiffness of the second linkage. Thus, due to any manner of linkage symmetries, both linkages may have similar motion responses to similar actuation inputs. Also due to linkage symmetries, both linkages may have similar thermal responses to environmental changes, e.g., experience similar thermal expansion. Thus, a remote center robot with symmetric linkages may provide for an economic assembly for manipulating a micro pick up array that is robust and self-compensates for environmental changes during use.

In another aspect, embodiments describe a remote center robot that includes an adjustment mechanism functionally coupled with at least one linkage having a remote center of rotation. More specifically, an adjustment link may interconnect with a link of a first linkage such that movement of the adjustment link modifies the geometry of the first linkage. In an embodiment, movement of the adjustment link changes a location of a center of rotation of the first linkage, for example, by shifting the location of the center in space relative to a center of rotation of a second linkage. Accordingly, the adjustment link may be adjusted to move the center of rotation of the first linkage into alignment with the center of rotation of a second linkage such that the linkages share a common center of rotation about which an object may tip or tilt without parasitic motion.

In another aspect, embodiments describe a remote center robot that includes a z-flexure to move a micro pick up array along a z-axis within a frame of reference. More particularly, a z-flexure may incorporate at least one linkage that constrains motion of the z-flexure along the z-axis. Motion of the z-flexure may be passive, or it may be active and driven by a z-actuator. In an embodiment, the z-actuator applies a deformation load to the z-flexure in a direction orthogonal to the constrained direction of motion of the z-flexure. A micro pick up array may be coupled with the z-flexure to provide precise and repeatable movement in a known direction. Thus, the z-flexure may move a micro pick up array along a z-axis to a center of rotation of the micro pick up array with a surface of the micro pick up array.

In another aspect, embodiments describe a remote center robot having one or more actuators to adjust a linkage geometry in response to position and pressure-related control signals. In an embodiment, separate actuators adjust individual linkages and flexures of a remote center robot to cause a micro pick up array to tip, tilt, and move along a z-axis. The actuators may be controlled in response to positional inputs, and those positional inputs may be adjusted based on feedback signals provided by one or more sensor outputs representing a strain state of a micro pick up array mount mechanism carrying the micro pick up array. Thus, a closed control loop may be used to reorient the micro pick up array such that pressure is uniformly distributed across the micro pick up array. More particularly, the micro pick up array may be reoriented to distribute a pressure gradient across the micro pick up array in a predetermined manner. In an embodiment, an actuator aligns a center of rotation at the micro pick up array surface such that on-the-fly reorientation of the micro pick up array may be made while the micro pick up array contacts a target substrate without damaging the micro pick up array or associated micro devices. Accordingly, overall production rate may be increased and transfer error rates may be reduced.

Referring to FIG. 1, a perspective view of a mass transfer tool is shown. Mass transfer tool 100 may include a remote center robot 500 for picking up an array of micro devices from a carrier substrate held by a carrier substrate holder 104 and for transferring and releasing the array of micro devices onto a receiving substrate held by a receiving substrate holder 106. Embodiments of mass transfer tool 100 are described in U.S. patent application Ser. No. 13/607,031, titled "Mass Transfer Tool", filed on Sep. 7, 2012, which is incorporated herein by reference. Operation of mass transfer tool 100 and remote center robot 500 may be controlled at least in part by a computer 108. Computer 108 may control the operation of remote center robot 500 based on feedback signals received from various sensors. For example, remote center robot 500 may include an actuator assembly for adjusting an associated micro pick up array 103 with at least three degrees of freedom, e.g., tipping, tilting, and movement in a z direction, based on feedback signals received from sensors associated with micro pick up array 103 or a component that carries micro pick up array 103. Similarly, the carrier substrate holder 104 and receiving substrate holder 106 may be moved by an x-y stage 110 of mass transfer tool 100, having at least two degrees of freedom, e.g., along orthogonal axes within a horizontal plane. Additional actuators may be provided, e.g., between mass transfer tool 100 structural components and remote center robot 500, carrier substrate holder 104, or receiving substrate holder 106, to provide movement in the x, y, or z direction for one or more of those sub-assemblies. For example, a gantry 112 may support remote center robot 500 and move remote center robot 500 along an upper beam, e.g., in a direction parallel to an axis of motion of x-y stage 110. Thus, an array of electrostatic transfer heads on micro pick up array 103, supported by remote center robot 500, and an array of micro devices supported by a carrier substrate held by carrier substrate holder 104 may be precisely moved relative to each other within all three spatial dimensions.

Figure 2:
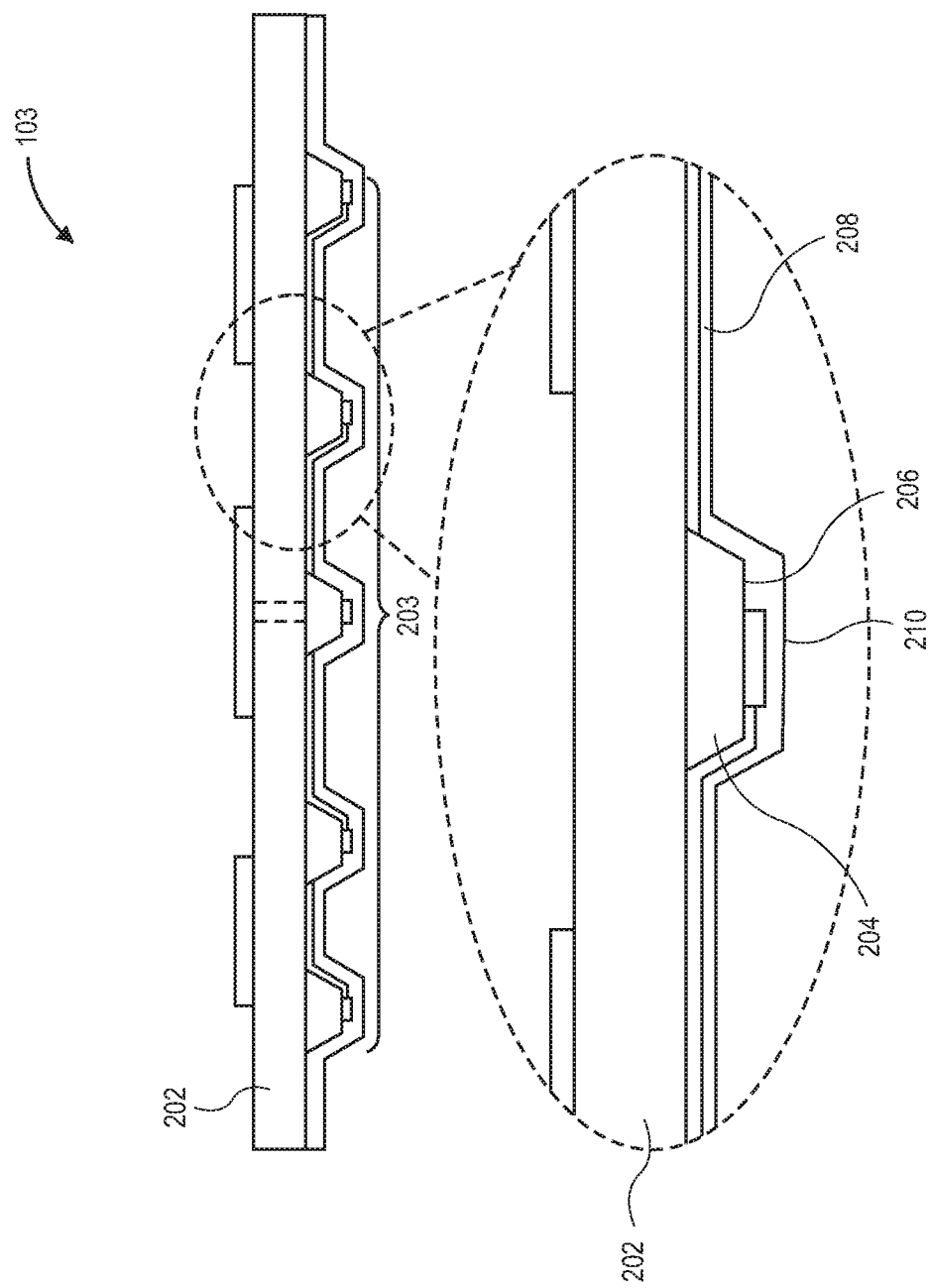
FIG. 2, is a side view of a micro pick up array having a substrate supporting an array of electrostatic transfer heads.

Referring to FIG. 2, a micro pick up array having a substrate supporting an array of electrostatic transfer heads is shown. Micro pick up array 103 may include a base substrate 202 supporting an array of electrostatic transfer heads 203. Each electrostatic transfer head 203 may include a mesa structure 204 including a top surface 206 covered by a dielectric layer 208. Furthermore, each electrostatic transfer head 203 may include electrical leads, electrodes, etc., necessary to generate an electrostatic gripping force on a micro device to be picked up.

In an embodiment, mesa structure 204 has a height of approximately 1 μm to 20 μm, or more specifically approximately 10 μm. In an embodiment, mesa structure 204 may have top surface 206 with surface area between 1 to 10,000 square micrometers. Furthermore, the top contact surface 210 of each electrostatic transfer head 203 may have a maximum dimension, for example a length or width of 1 to 100 μm, which may correspond to the size of a micro device to be picked up. For example, top contact surface 210 may have a surface area of about 5 μm by 5 μm or 10 μm by 10 μm. Thus, the height, width, and planarity of the array of mesa structures on base substrate 202 may be chosen so that each electrostatic transfer head 203 can make contact with a corresponding micro device during a pick up operation, and so that an electrostatic transfer head 203 does not inadvertently make contact with a micro device adjacent to an intended corresponding micro device during the pick up operation. Given the small geometry of micro pick up array and micro device geometry, movements between micro pick up array and micro devices must be accurately controlled to avoid damaging either electrostatic transfer heads 203 or micro devices on a target substrate.

Figure 3:
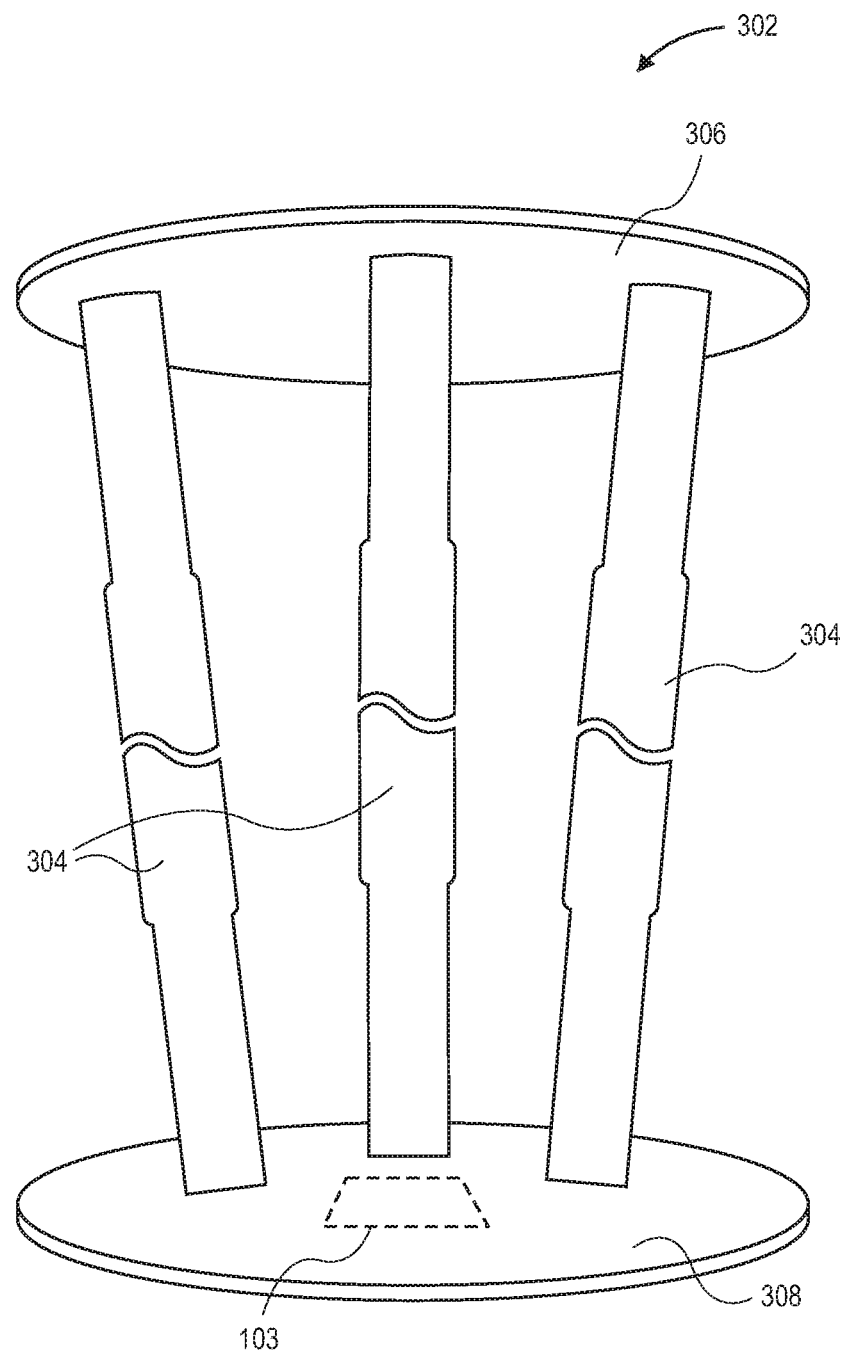
FIG. 3 is a side view of a generic actuator assembly having a plurality of actuators.

Referring to FIG. 3, a side view of a generic actuator assembly having a plurality of actuators is shown. A generic actuator assembly 302 may include, e.g., a tripod or a hexapod robot to adjust a micro pick up array 103 relative to mass transfer tool 100 with at least three degrees of freedom, e.g., tipping, tilting, and movement in a z direction. Accordingly, actuator assembly 302 may include at least one actuator 304, e.g., a piezoelectric linear actuator, which creates motion between mass transfer tool mount 306 and distribution plate 308. More particularly, actuator assembly 302 may tip and tilt distribution plate 308 relative to mass transfer tool mount 306 that connects generic actuator assembly 302 to mass transfer tool 100. As a result, an orientation of a micro pick up array 103 coupled with distribution plate 308 may be varied relative to mass transfer tool mount 306.

Figure 4:
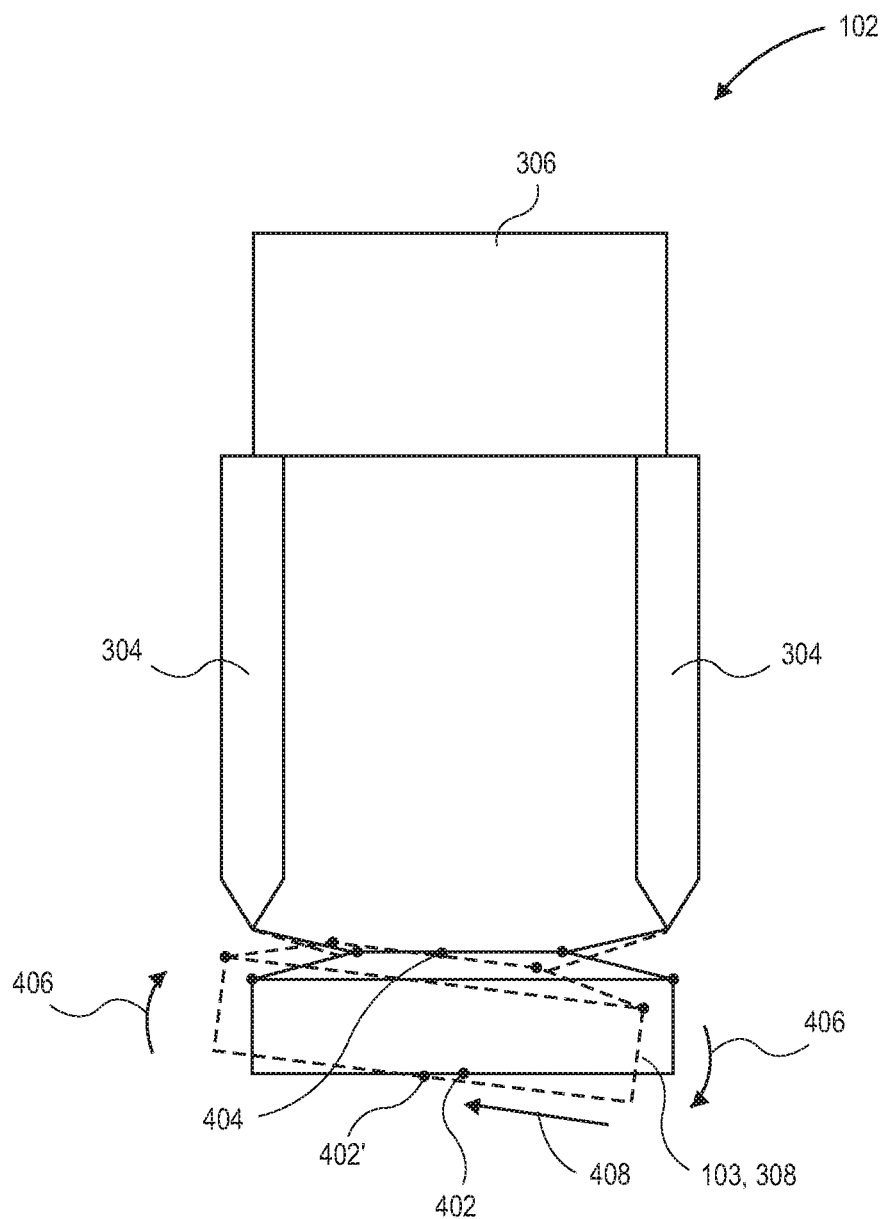
FIG. 4 is a schematic view of a generic actuator assembly for adjusting an orientation of a micro pick up array.

Referring to FIG. 4, a schematic view of a generic actuator assembly 302 for adjusting an orientation of micro pick up array 103 is shown. A combined block representing distribution plate 308 carrying micro pick up array 103 may be mechanically coupled with mass transfer tool mount 306 through one or more actuator 304. Thus, actuation of actuator 304 causes micro pick up array 103 to move relative to mass transfer tool mount 306. More specifically, actuation of actuator 304 may cause an electrostatic transfer head 203 on micro pick up array 103 to move from an electrostatic transfer head position 402 to an electrostatic transfer head position 402'. Furthermore, the schematic illustration shows that the actuator assembly 302 includes a rotational center 404 about which micro pick up array 103 rotates. For example, as indicated in the schematic illustration, extension of a rightmost actuator combined with retraction of a leftmost actuator may result in a clockwise primary rotation 406 of micro pick up array 103 about rotational center 404.

Rotational center 404 may be at a point above distribution plate 308, and thus, micro pick up array 103 may pivot around rotational center 404. More particularly, since electrostatic transfer heads 203 on micro pick up array 103 are not coincident with rotational center 404, rotation of micro pick up array 103 about rotational center 404 may be accompanied by parasitic translation 408 of micro pick up array 103 as electrostatic transfer heads 203 shift from electrostatic transfer head position 402 to electrostatic transfer head position 402'. For example, parasitic translation 408 may be on the order of tens of microns of lateral motion. This range of motion may represent a significant distance in proportion to a width of electrostatic transfer heads 203. Thus, if micro pick up array 103 is rotated about rotational center 404 after electrostatic transfer heads 203 make contact with a micro device on a target substrate, parasitic translation 408 may smear electrostatic transfer head 203 across a micro device on a surface of the substrate, potentially damaging the electrostatic transfer head 203, micro device, or substrate. In an embodiment, an x-y stage 110 may be controlled to move beneath micro pick up array 103 to match parasitic translation 408 and compensate for relative movement between the electrostatic transfer head 203 and the micro device, which is inherent in tripod and hexapod robots. However, such compensation may be difficult to achieve over sub-micron distances and at the high motion rates required under product manufacturing conditions. Furthermore, hexapod robots may be expensive and complicated to incorporate in mass transfer tool 100.

Figure 5:
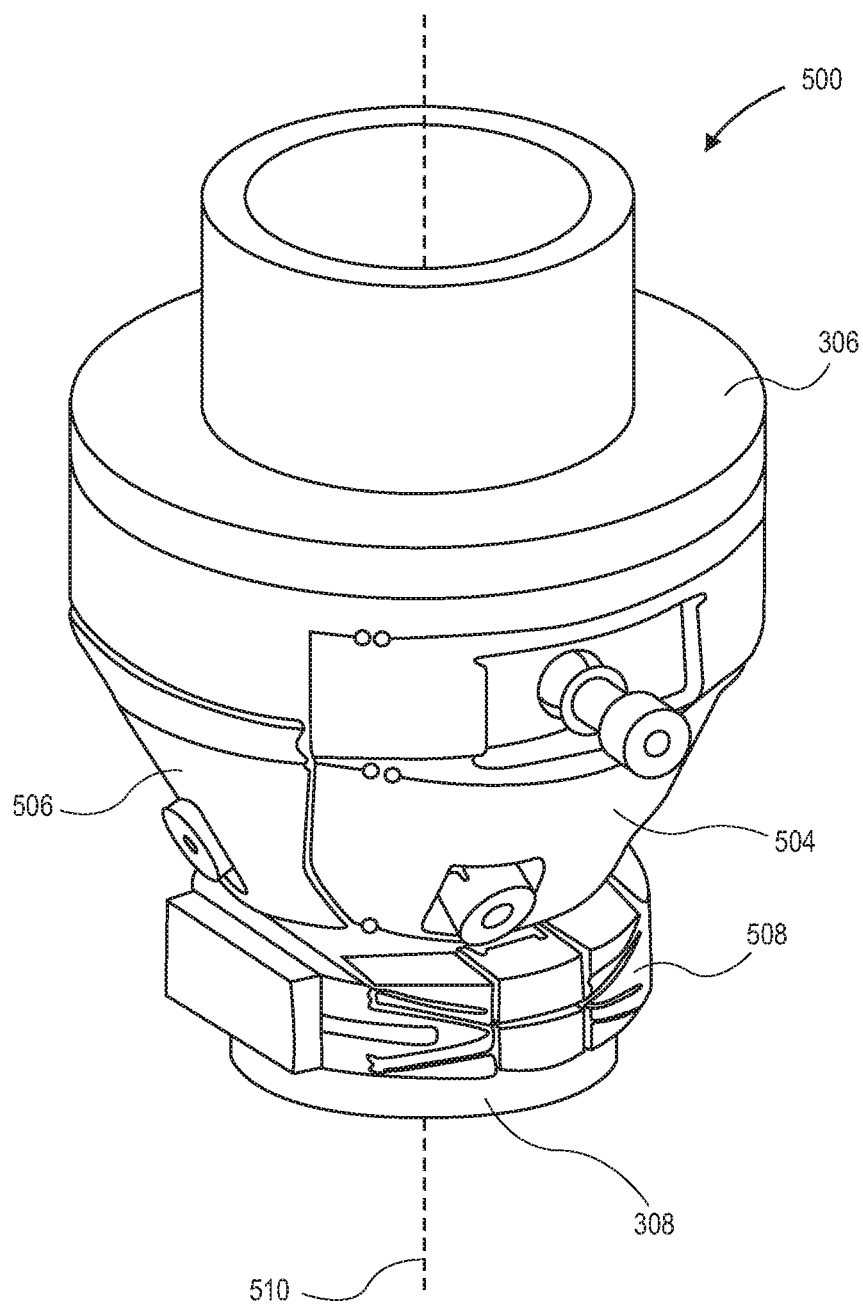
FIG. 5 is a perspective view of a remote center robot in accordance with an embodiment.

Referring to FIG. 5, a perspective view of a remote center robot is shown in accordance with an embodiment. A remote center robot 500 may be used in combination with mass transfer tool 100 to transfer micro devices to or from a substrate, e.g., receiving substrate or carrier substrate, using micro pick up array 103. More particularly, remote center robot 500 may provide for negligible lateral or vertical parasitic motion for small movements of micro pick up array 103, e.g., motion less than about 5 mrad about a neutral position. Accordingly, remote center robot 500 may be incorporated in mass transfer tool 100 to adjust a micro pick up array 103 relative to mass transfer tool 100. Thus, remote center robot 500 may include mass transfer tool mount 306 that may be fixed to a chassis of mass transfer tool 100, e.g., at a location along an upper beam or support.

In an embodiment, remote center robot 500 includes multiple linkages having independent ranges of motion. For example, remote center robot 500 may include an x-linkage 504 coupled with mass transfer tool mount 306 and having links interconnected at joints such that the links exhibit kinematics in a first plane, e.g., movement of x-linkage 504 may include a coupler link tipping relative to a ground link. Remote center robot 500 may also include a y-linkage 506 coupled with x-linkage 504 and having links that exhibit kinematics in a second plane different than the first plane, e.g., movement of y-linkage 506 may include a coupler link tilting relative to a ground link. Remote center robot 500 may also include z-flexure 508 coupled with y-linkage 506 and having a structure that lengthens and shortens along a z-axis 510.

In an embodiment, x-linkage 504, y-linkage 506, and z-flexure 508 are structurally connected such that kinematics of each linkage is related but independent. For example, in an embodiment, a ground link of x-linkage 504 is fixed relative to mass transfer tool mount 306 and a first end of z-flexure 508 is fixed to a distribution plate 308. Furthermore, a coupler link of x-linkage 504 may carry a ground link of y-linkage 506, and a coupler link of y-linkage 506 may carry a second end of z-flexure 508 such that movement of any of x-linkage 504, y-linkage 506, and z-flexure 508 results in a relative movement between mass transfer tool mount 306 and distribution plate 308. Thus, remote center robot 500 may be used to control a spatial orientation of an object, e.g., a micro pick up array 103 connected to distribution plate 308. In an embodiment, a micro pick up array mount may intervene between micro pick up array 103 and distribution plate 308. As discussed below, micro pick up array mount may be a coupling component suited to carry micro pick up array 103 on a first side and to connect to distribution plate 308 at a second side.

In an embodiment, the interrelated movement of x-linkage 504, y-linkage 506, and z-flexure 508 may nonetheless be independent, such that movement of any one of the components provides pure motion of distribution plate 308. For example, movement of x-linkage 504 may cause distribution plate 308 to tip relative to mass transfer tool mount 306, movement of y-linkage 506 may cause distribution plate 308 to tilt relative to mass transfer tool mount 306, and movement of z-flexure 508 may cause distribution plate 308 to extend away from or retract toward mass transfer tool mount 306. More particularly, such relative movement between distribution plate 308 and mass transfer tool mount 306 may be independently constrained within the ranges of motion of each linkage without motion in one reference frame causing motion in another. For example, tipping of distribution plate 308 within a first plane caused by movement of x-linkage 504 may not include any parasitic tilting in a second plane. Thus, decoupling remote center robot 500 linkages may provide pure motion of distribution plate 308 about different rotational centers and in different axial directions.

Figure 6:
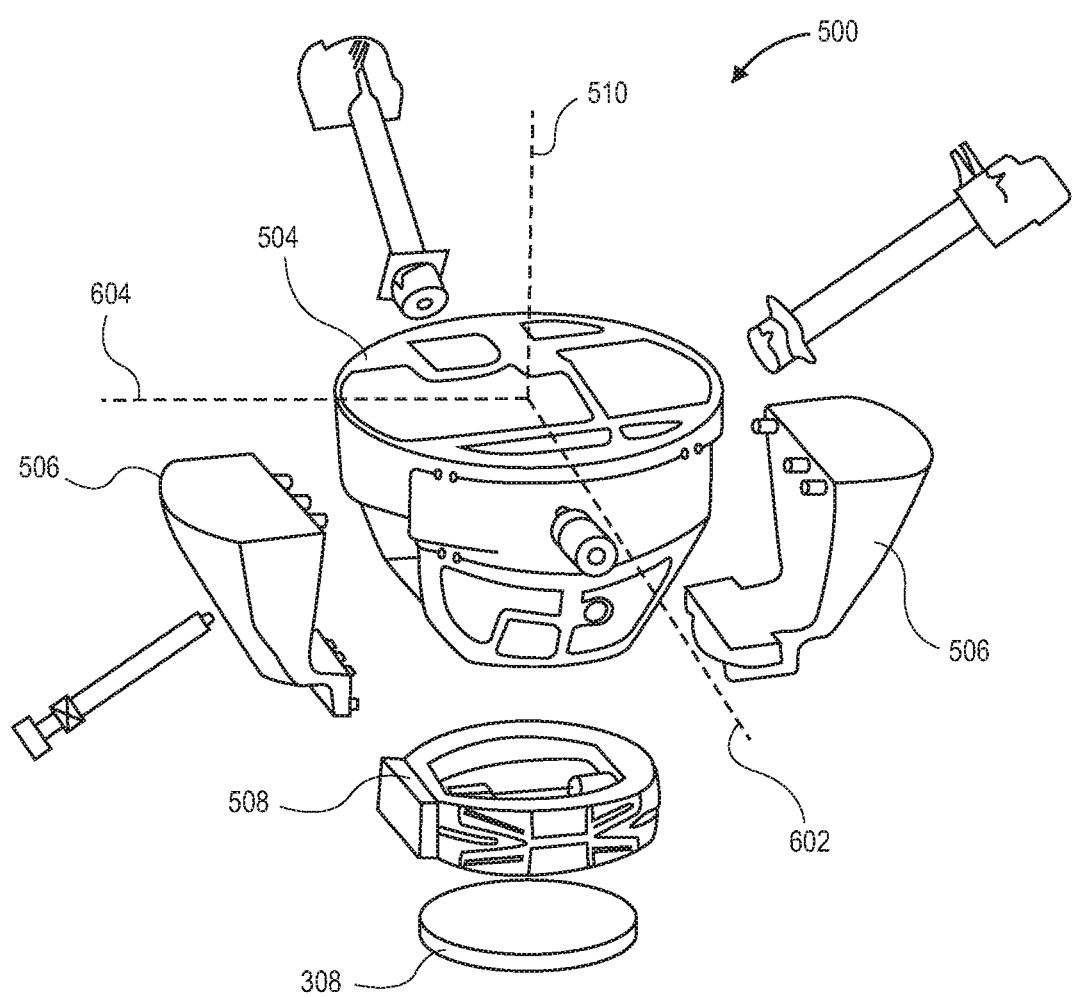
FIG. 6 is an exploded view of a remote center robot in accordance with an embodiment.

Referring to FIG. 6, an exploded view of a remote center robot is shown in accordance with an embodiment. X-linkage 504 and y-linkage 506 may each include a multi-link structure. For example, x-linkage 504 and y-linkage 506 may each include at least two links, e.g., a ground link and a link arm, or may include three or more links, e.g., a ground link, one or two link arms, and a coupler link. The linkages may further be aligned with planes that are substantially orthogonal, i.e., x-linkage 504 and y-linkage 506 may be substantially orthogonal to each other. For example, x-linkage 504 may act within a y-z plane encompassing a y-axis 602 and z-axis 510, while y-linkage 506 may act within an x-z plane encompassing an x-axis 604 and z-axis 510.

In an embodiment, components of remote center robot 500 may be monolithically formed or formed in pieces. For example, x-linkage 504 may be formed as a single piece of material with joints, e.g., living hinge flexures, which permit the single piece to flex and change geometry as a whole. Alternatively, such as in the case of y-linkage 506, linkages may be formed in halves that are joined together directly or by being coupled with intermediate components to form a linkage structure. Remote center robot 500 may be formed from known materials, such as steel alloys, nickel-iron alloys, e.g., Invar, or other plastic, ceramic, or metal materials. Known manufacturing processes such as milling, laser cutting, electrical discharge machining, etc., may be used to form remote center robot 500 components.

In an embodiment, x-linkage 504 and y-linkage 506 are geometrically symmetric. For example, the links of x-linkage 504 and y-linkage 506 may have substantially equal lengths. More particularly, corresponding links of each linkage may or may not have substantially equal lengths. For example, link arms of each linkage may have a same first length and coupler links of each linkage may have a same second length, but the first length may or may not be equal to the second length. Equal length links may provide for a similar thermal response of x-linkage 504 and y-linkage 506 to environmental changes. For example, if temperatures local to remote center robot 500 change due to heating provided during use, each of the links may undergo similar thermal expansion.

In an embodiment, similar thermal expansion of x-linkage 504 links and y-linkage 506 links may be further facilitated through material choice. For example, corresponding links for each linkage may be formed from the same material, e.g., steel alloys, Invar, etc. Thus, corresponding links may have similar or equal coefficients of thermal expansion and may accordingly exhibit similar thermal expansion. As a result, x-linkage 504 and y-linkage 506 may exhibit self-thermal compensation because both linkage geometries may respond similarly to temperature changes.

X-linkage 504 and y-linkage 506 may have linkage angles that are symmetric about a given reference geometry. For example, an angle between link arms of each linkage and z-axis 510 may be equal, or approximately equal. Thus, as an example, an angle between each link arm of x-linkage 504 and z-axis 510 may be about 30 degrees and an angle between each link arm of y-linkage 506 and z-axis 510 may also be about 30 degrees. Therefore, linkage response to actuator inputs may be similar. For example, given that x-linkage 504 and y-linkage 506 may have similar geometric angles, actuation of respective link arms by respective actuators may cause similar angular changes of the link arms relative to z-axis 510. More particularly, an actuator coupled with an x-linkage 504 link arm and an actuator coupled with a y-linkage 506 link arm may be moved similar amounts to cause similar tipping or tilting responses in x-linkage 504 and y-linkage 506, respectively.

In an embodiment, x-linkage 504 and y-linkage 506 are structurally symmetric. For example, the overall structural stiffness of x-linkage 504 and y-linkage 506 may be similar. Overall structural stiffness may be measured by a motion response in relation to an input actuation. For example, in a case in which respective actuators place lateral loads on respective link arms to cause x-linkage 504 to tip and y-linkage 506 to tilt, the linkages may have a same composite stiffness if a same load applied by the respective actuators causes an equal degree of tipping or tilting in the respective linkages. The overall structural stiffness may be a function of joints that connect links in the linkages, e.g., living hinge flexures, but may also be a function of the system stiffness created by actuators, springs, and various couplers that hold the linkages together or impart loads on the linkages.

Figure 7:
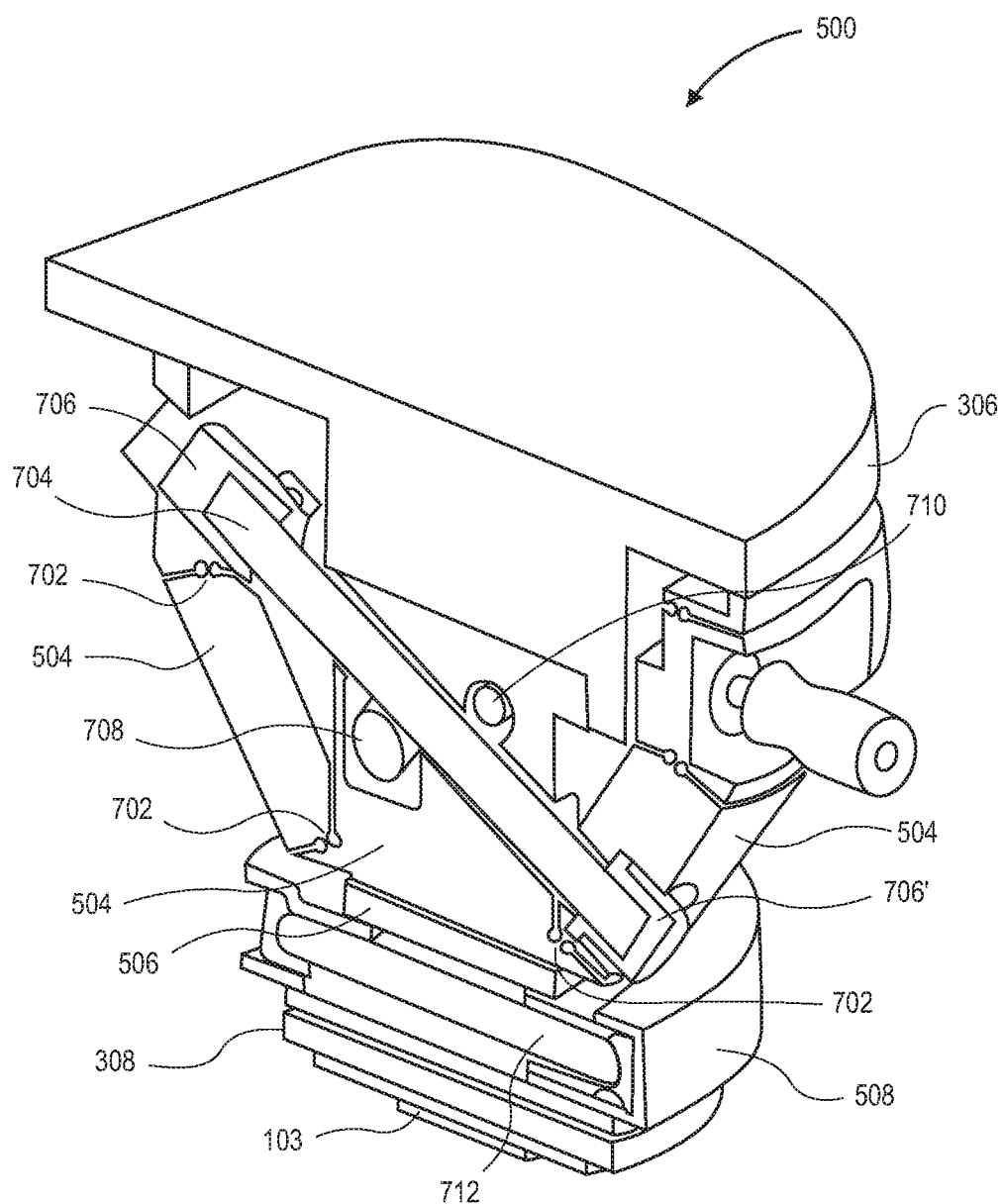
FIG. 7 is a cross-sectional perspective view of a remote center robot in accordance with an embodiment.

Referring to FIG. 7, a cross-sectional perspective view of a remote center robot is shown in accordance with an embodiment. As shown, the cross-sectional view passes through x-linkage 504 of remote center robot 500 and exposes several joints 702 connecting individual links of the linkage structure. Joints 702 may include living hinges having thin flexures that may repeatedly flex without failing. For example, a living hinge may be formed between x-linkage 504 links by forming the links as part of a single piece of material, in which the links are connected by a thin flap of material. The flap of material may be formed by removing material from the single piece of material using, e.g., electric discharge machining, or by forming the single piece of material with the thin hinge feature, e.g., during molding or casting. Living hinge flexures may provide low or no hysteresis and repeatable motion over a system service life. Alternatively, joints 702 may be other bearing structures, such as barrel hinges, ball and socket joints, etc. Joints 702 allow links of x-linkage 504 to move relative to one another and relative to other structures to which such links are connected. For example, a ground link of x-linkage 504 may be connected to mass transfer tool mount 306 and to a link arm of x-linkage 504. Thus, movement of the link arm relative to the ground link also results in movement of the link arm relative to mass transfer tool mount 306. These relative movements can be geometrically defined and modelled such that any point in remote center robot 500 may be predicted relative to another point in remote center robot 500 based on known motion inputs.

Motion inputs on the linkages of remote center robot 500 may be applied through loads imparted by a variety of actuators and loading elements. For example, in an embodiment, an x-actuator 704 imparts a biasing load to x-linkage 504 structure. More particularly, x-actuator 704 may be a linear actuator having two ends, and each end may be connected or constrained relative to x-linkage 504 such that linear motion of x-actuator 704 causes x-linkage 504 geometry to change. For example, a flexural coupler 706 may be located at one or both ends of x-actuator 704. Flexural coupler 706 may transmit loading to opposing links of x-linkage 504, e.g., between a ground link and a link arm, from x-actuator 704. Simultaneously, flexural coupler 706 may allow some angular movement of x-actuator 704. More particularly, flexural couplers 706 may act like ball joints to allow x-actuator 704 to passively change angle to accommodate a changing x-linkage 504 geometry. That is, flexural couplers 706 may provide a limited range of motion in two rotational directions, both of which are orthogonal to the line of x-actuator 704 action, between an end of x-actuator 704 and a location at which the x-actuator 704 end is to be connected, e.g., at a ground link of x-linkage 504. In an embodiment, x-actuator 704 includes a fixed end with a first flexural coupler 706 fixed to an x-linkage 504 link, e.g., a ground link, and a moving end with a second flexural coupler 706' movable relative to another x-linkage 504 link, e.g., a link arm. Thus, flexural couplers 706 and 706' allow loading of x-linkage 504 to create linkage movement without over-constraining the linkage system. In an embodiment, actuators of remote center robot 500, such as x-actuator 704 may be piezoelectric actuators. Although other linear actuators may be used, e.g., hydraulic, pneumatic, or electromechanical actuators, a piezoelectric actuator may exhibit fine positioning resolution through relatively short movements.

Y-linkage 506 may also include a four-bar linkage structure having links connected by joints 702. Furthermore, forces may be imparted to y-linkage 506 by one or more actuators or loading elements, such as a y-actuator 708 and a spring stack 710 passing through remote center robot 500 orthogonal to x-actuator 704. Y-actuator 708 may impart loads to y-linkage 506 to cause the linkage structure to move. Similarly, spring stack 710 may include a reactive load, such as by incorporating an extension or a compression spring, which counteracts the loading applied by y-actuator 708. For example, whereas y-actuator 708 may push on a link arm of y-linkage 506, spring stack 710 may pull on the link arm. X-linkage 504 loading may be similarly counteracted by a corresponding spring stack. As a result of these opposing loads, the linkage structure may be preloaded and biased toward one direction. The preload may also provide a known composite stiffness to the linkage. Therefore, linkage motion may be more uniformly controlled by actuation of y-actuator 708 since the actuator need only be precisely moveable in one direction and since the opposing loads to the actuation load may be known.

In addition to providing a known, repeatable opposing load to the actuation direction and to providing preloading bias and anti-backlash, spring stack 710 may also assist an actuator, such as y-actuator 708, to retract to a neutral position. For example, in an embodiment in which y-actuator 708 generates more force in an extension direction than in a retraction direction, e.g., it pushes with greater force than it pulls, spring stack 710 may compensate y-actuator 708 in the retraction direction to return y-actuator to an initial, neutral position.

In an embodiment, z-flexure 508 is connected to y-linkage 506 such that y-linkage 506 carries z-flexure 508. Furthermore, z-flexure 508 may be connected to z-actuator 712, which may be capable of loading the structure of z-flexure 508. More particularly, in an embodiment, z-actuator 712 extends and retracts in a direction orthogonal to a direction of deformation of z-flexure 508. For example, z-actuator 712 may place a radial load on an annular structure of z-flexure 508 in a direction of y-axis 602, and the radial load may cause z-flexure 508 to increase or decrease in length along an axial direction, e.g., z-axis 510.

Figure 8:
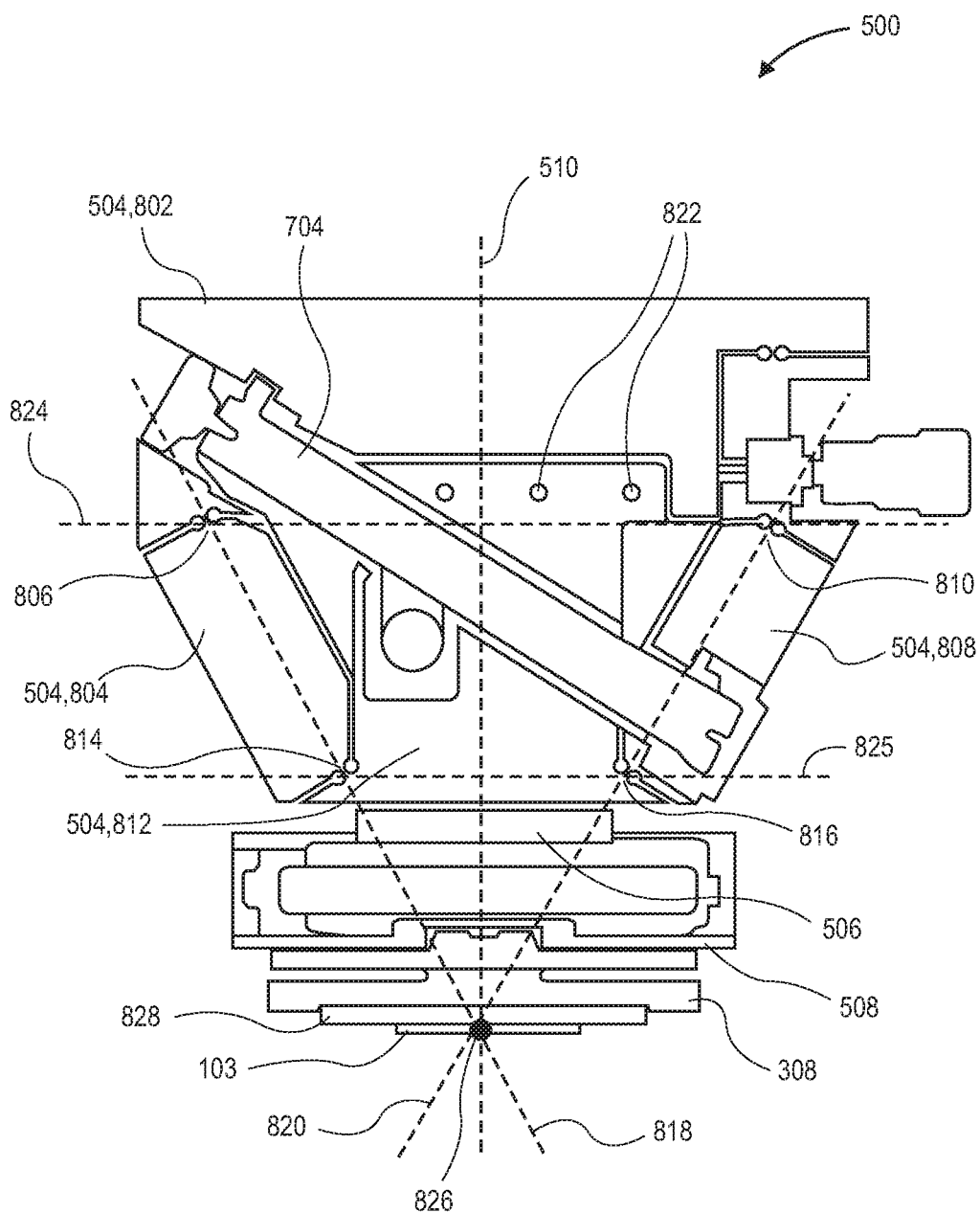
FIG. 8 is a cross-sectional plan view of an x-linkage of a remote center robot in accordance with an embodiment.

Referring to FIG. 8, a cross-sectional plan view of an x-linkage of a remote center robot is shown in accordance with an embodiment. In an embodiment, the cross-sectional plan view is taken about a y-z plane encompassing y-axis 602 and z-axis 510. X-linkage 504 may include various elements that constitute links in a four-bar linkage structure. For example, x-linkage 504 may include an x-linkage ground 802. As discussed above, x-linkage ground 802 may be connected with mass transfer tool mount 306, e.g., by fastening x-linkage ground 802 to a flange of mass transfer tool mount 306. Thus, x-linkage ground 802 may be fixed relative to mass transfer tool mount 306 of mass transfer tool 100.

In an embodiment, x-linkage 504 includes at least one link arm connected to x-linkage ground 802. For example, an x-linkage left link arm 804 may connect to x-linkage ground 802 at an x-linkage upper left joint 806. X-linkage upper left joint 806 may include a living hinge flexure that allows x-linkage left link arm 804 to pivot relative to x-linkage ground 802. X-linkage 504 may also include x-linkage right link arm 808 located opposite z-axis 510 from x-linkage left link arm 804. More particularly, x-linkage right link arm 808 may pivot about an x-linkage upper right joint 810, which may be located opposite the x-z plane, i.e., the plane encompassing x-axis 604 and z-axis 510, from x-linkage upper left joint 806. X-linkage 504 may also include x-linkage coupler 812 connected with one or both of x-linkage left link arm 804 and x-linkage right link arm 808. For example, x-linkage coupler 812 may connect with x-linkage left link arm 804 at x-linkage lower left joint 814 and x-linkage coupler 812 may connect with x-linkage right link arm 808 at x-linkage lower right joint 816. Thus, x-linkage 504 may include a four-bar linkage having a ground link, two link arms, and a coupler link, interconnected by four joints 702.

Each link of x-linkage 504 may include a respective shape and volume. However, the shape and volume of each link may not be the same. For example, x-linkage left link arm 804 may include an elongated shape extending along x-linkage left axis 818 between x-linkage upper left joint 806 and x-linkage lower left joint 814, and x-linkage right link arm 808 may include an elongated shape extending along x-linkage right axis 820 between x-linkage upper right joint 810 and x-linkage lower right joint 816. However, even though each link arm may be generally elongated, each may include different shapes and volumes, e.g., x-linkage right link arm 808 may have a hole to allow x-actuator 704 to pass through x-linkage right link arm 808 while x-linkage left link arm 804 may not include such a hole. Furthermore, the shape and volume of each link arm may be substantially different from those of x-linkage ground 802 or x-linkage coupler 812, which may both include substantially more volume or have a substantially different shape specific to their function. For example, x-linkage coupler 812 may be vertically arranged with substantially more volume along z-axis 510 between x-linkage 504 lower joints and one or more coupler mount 822 than x-linkage 504 link arm volumes. The vertical arrangement may allow for x-linkage 504 to carry y-linkage 506 such that y-linkage may be symmetric with x-linkage 504.

In an embodiment, although volumes of links may vary, a mass of corresponding links in a linkage or between linkages may be kept the same. For example, x-linkage left link arm 804 may have a different shape than x-linkage right link arm 808 due, for example, to a hole for receiving x-actuator 704, but a boss may be added to x-linkage right link arm 808 or x-linkage left link arm 804 may be made thinner to allow for the overall volume and mass of the link arms to be substantially equal. Furthermore, additional parts, such as a bolt formed from a material with a higher density than the link arm material, may be added to a link arm having less volume to compensate for the reduced volume and create a substantially equal mass for both link arm composite structures. Maintaining equal link arm mass may provide an additional symmetry within and between linkages to allow for uniform motion response to the same actuation loads.

Uniform motion response to the same actuation loads may be achieved in other manners. In an embodiment, the inertial characteristics of linkages about a given point may be asymmetric and yet the linkages may still exhibit similar motion about the point in response to loading from respective actuators. More particularly, motion of a linkage about the point may depend on a moment of inertia of the linkage about the point, as well as a load magnitude and a distance from the point at which a respective actuator applies the load. Thus, assuming similar load magnitudes are applied from respective actuators, motion response between linkages may be the same when the relationship between a location of the load on a linkage relative to the point of interest, and the moment of inertia of the linkage about the point of interest, remains the same. For example, in an embodiment, x-actuator 704 places a load amount on x-linkage 504 further from remote tipping center 826 than y-actuator 704 places the same load amount on y-linkage 506 relative to a remote tilting center. Nonetheless, x-linkage 504 and y-linkage 506 may have a similar motion about respective remote centers in response to the different loading conditions, if a moment of inertia of x-linkage 504 about remote tipping center 826 is correspondingly increased relative to a moment of inertia of y-linkage 506 about the remote tilting center. Accordingly, one of ordinary skill in the art may modify actuator loading location, linkage mass distribution, and linkage joint stiffness such that linkages exhibit uniform motion about remote centers of rotation in response to actuator loading.

Even in a case in which x-linkage 504 links do not share similar shapes, volumes, or masses, x-linkage 504 may nonetheless include geometric symmetries as described above. Accordingly, x-linkage left axis 818 may form a first angle with z-axis 510 and x-linkage right axis 820 may form a similar or identical second angle with z-axis 510. For example, the first and second angle may each be approximately 30 degrees, resulting in a total sweep angle of about 60 degrees between x-linkage left axis 818 and x-linkage right axis 820. In an embodiment, an additional symmetry includes x-linkage upper right joint 810 and x-linkage upper left joint 806 being coplanar within an upper plane 824. Similarly, x-linkage lower right joint 816 and x-linkage lower left joint 814 may be coplanar within a lower plane 825. Accordingly, x-linkage 504 may be symmetric about the x-z plane encompassing x-axis 604 and z-axis 510, in numerous manners.

In an embodiment, x-linkage 504 includes a remote tipping center 826 located at an intersection of x-linkage left axis 818 and x-linkage right axis 820. Remote tipping center 826 may be a virtual center of rotation with a spatial position that remains constant as x-linkage 504 link arms change orientation. For example, in an embodiment, as x-linkage left link arm 804 pivots about x-linkage upper left joint 806, a corresponding motion of x-linkage right link arm 808 may cause the angles between x-linkage left axis 818, x-linkage right axis 820, and z-axis 510 to change. However, the location of remote tipping center 826 may remain stationary despite the change in linkage geometry. More particularly, as x-linkage 504 geometry changes, x-linkage coupler 812 may rotate about remote tipping center 826. Thus, a point on an object that is fixed relative to x-linkage coupler 812 and located at remote tipping center 826 may experience pure rotation, unaccompanied by translational parasitic motion, when x-linkage 504 geometry is varied.

The phenomenon of pure rotation about remote tipping center 826 may be exploited by locating transfer elements for which parasitic motion is undesirable at remote tipping center 826. For example, z-flexure 508 and distribution plate 308 may be fixed relative to y-linkage 506, which in turn may be fixed relative to x-linkage coupler 812 at coupler mounts 822, such that a micro pick up array mount 828 on distribution plate 308 may carry micro pick up array 103 with a surface co-located with remote tipping center 826. More particularly, an electrostatic transfer head 203 on micro pick up array 103 may be co-located with remote tipping center 826 during movement of x-linkage 504. As a result, as x-linkage 504 geometry varies, electrostatic transfer head 203 may experience pure tipping and remain in the same lateral location, rather than shifting under parasitic translation and potentially smearing a corresponding micro device on a mating substrate surface.

Figure 9:
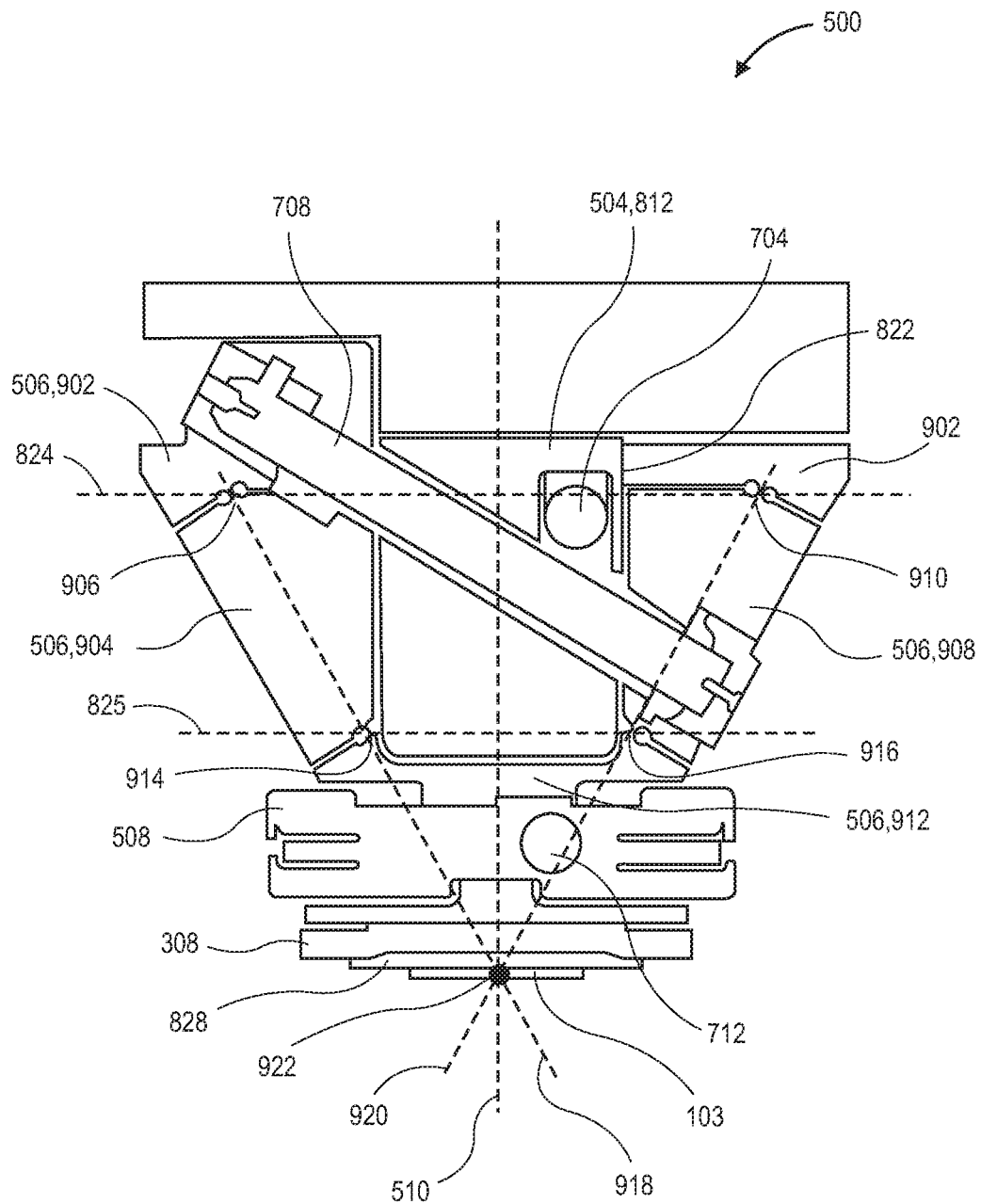
FIG. 9 is a cross-sectional plan view of a y-linkage of a remote center robot in accordance with an embodiment.

Referring to FIG. 9, a cross-sectional plan view of a y-linkage of a remote center robot is shown in accordance with an embodiment. In an embodiment, the cross-sectional plan view is taken about the x-z plane encompassing x-axis 604 and z-axis 510. Like x-linkage 504, y-linkage 506 may include several links constituting a linkage structure. For example, y-linkage 506 may include a y-linkage ground 902. However, rather than being fixed relative to mass transfer tool mount 306, y-linkage ground 902 may be moveable relative to mass transfer tool mount 306. More particularly, y-linkage ground 902 may be fixed relative to x-linkage coupler 812 at coupler mount 822 or another location. Accordingly, when x-linkage 504 is moved by actuating x-linkage 504 link arms, x-linkage coupler 812 moves relative to mass transfer tool mount 306 and since y-linkage ground 902 is carried on x-linkage coupler 812, so may y-linkage ground 902 move relative to mass transfer tool mount 306.

In an embodiment, y-linkage 506 includes at least one link arm connected to y-linkage ground 902. For example, a y-linkage left link arm 904 may connect to y-linkage ground 902 at a y-linkage upper left joint 906. Y-linkage upper left joint 906 may include a living hinge flexure that allows y-linkage left link arm 904 to pivot relative to y-linkage ground 902. Y-linkage 506 may also include y-linkage right link arm 908 located opposite z-axis 510 from y-linkage left link arm 904. More particularly, y-linkage right link arm 908 may pivot about a y-linkage upper right joint 910, which is located opposite the y-z plane, encompassing y-axis 602 and z-axis 510, from y-linkage upper right joint 910. Y-linkage 506 may also include y-linkage coupler 912 connected with one or both of y-linkage left link arm 904 and y-linkage right link arm 908. For example, y-linkage coupler 912 may connect with y-linkage left link arm 904 at y-linkage lower left joint 914 and y-linkage coupler 912 may connect with y-linkage right link arm 908 at y-linkage lower right joint 916. Thus, in an embodiment, y-linkage 506 includes a linkage structure similar to x-linkage 504, having a ground link, two link arms, and a coupler link, interconnected by four joints 702.

Like x-linkage 504, each link of y-linkage 506 may include a respective shape and mass. However, the shapes and masses of each link may not be the same. For example, y-linkage left link arm 904 may include a triangular or polygonal shape through which y-linkage left axis 918 passes between y-linkage upper left joint 906 and y-linkage lower left joint 914. Similarly, y-linkage right link arm 908 may include a triangular or polygonal shape through which y-linkage right axis 920 passes between y-linkage upper right joint 910 and y-linkage lower right joint 916. However, even though each link arm may be generally triangular or polygonal, each may include different features, e.g., to account for a hole to allow y-actuator 708 to pass through y-linkage right link arm 908. Furthermore, the shapes of each link arm may be substantially different from those of y-linkage ground 902 or y-linkage coupler 912. Also like x-linkage 504, y-linkage 506 geometry and configurations may be manipulated such that link arms include similar volumes and/or mass to facilitate equivalent motion response.

Y-linkage 506 may also be symmetric about the y-z plane in numerous manners.

For example, y-linkage 506 link arms may exhibit similar lengths and/or make similar angles with z-axis 510. Furthermore, in an embodiment, y-linkage upper right joint 910 and y-linkage upper left joint 906 are coplanar within upper plane 824. Similarly, y-linkage lower right joint 916 and y-linkage lower left joint 914 may be coplanar within lower plane 825.

In addition to exhibiting symmetries about respective planes passing through z-axis 510, x-linkage 504 and y-linkage 506 may also be symmetric relative to each other. That is, upper joints 702 of x-linkage 504 may be coplanar within upper plane 824 relative to upper joints 702 of y-linkage 506. Similarly, lower joints 702 of x-linkage 504 may be coplanar within lower plane 825 relative to lower joints 702 of y-linkage 506. Furthermore, x-linkage left axis 818 may form a first angle with z-axis 510 that is equal to a first angle formed with z-axis 510 by y-linkage left axis 918. Alternatively, an angle between x-linkage 504 link arms may be equal to an angle between y-linkage 506 link arms. Accordingly, although x-linkage 504 and y-linkage 506 may have links of different shapes and volumes, the lengths, locations, and angles of the links may be similar or identical between the linkages.

In an embodiment, y-linkage 506 includes a remote tilting center 922 located at an intersection of y-linkage left axis 918 and y-linkage right axis 920. Remote tilting center 922 may be a virtual center of rotation with a spatial position that remains constant as y-linkage 506 link arms change orientation. For example, in an embodiment, as y-linkage left link arm 904 pivots about y-linkage upper left joint 906, a corresponding motion of y-linkage right link arm 908 may cause the angles between y-linkage left axis 918, y-linkage right axis 920, and z-axis 510 to change. However, the location of remote tilting center 922 may remain stationary despite the change in linkage geometry. More particularly, as y-linkage 506 geometry changes, y-linkage coupler 912 may rotate about remote tilting center 922. Thus, a point on an object that is fixed relative to y-linkage coupler 912 and located at remote tilting center 922 may experience pure rotation, unaccompanied by translational parasitic motion, when y-linkage 506 geometry is varied.

The phenomenon of pure rotation about remote tilting center 922 may be exploited by locating transfer elements for which parasitic motion is undesirable at remote tilting center 922. For example, an electrostatic transfer head 203 on micro pick up array 103 connected with micro pick up array mount 828, distribution plate 308, and z-flexure 508, may be co-located with remote tilting center 922 during movement of y-linkage 506. As a result, as y-linkage 506 geometry varies, electrostatic transfer head 203 may experience pure tilting and remain in the same lateral location, rather than shifting under parasitic translation and potentially smearing a corresponding micro device on a mating substrate surface.

Figure 10:
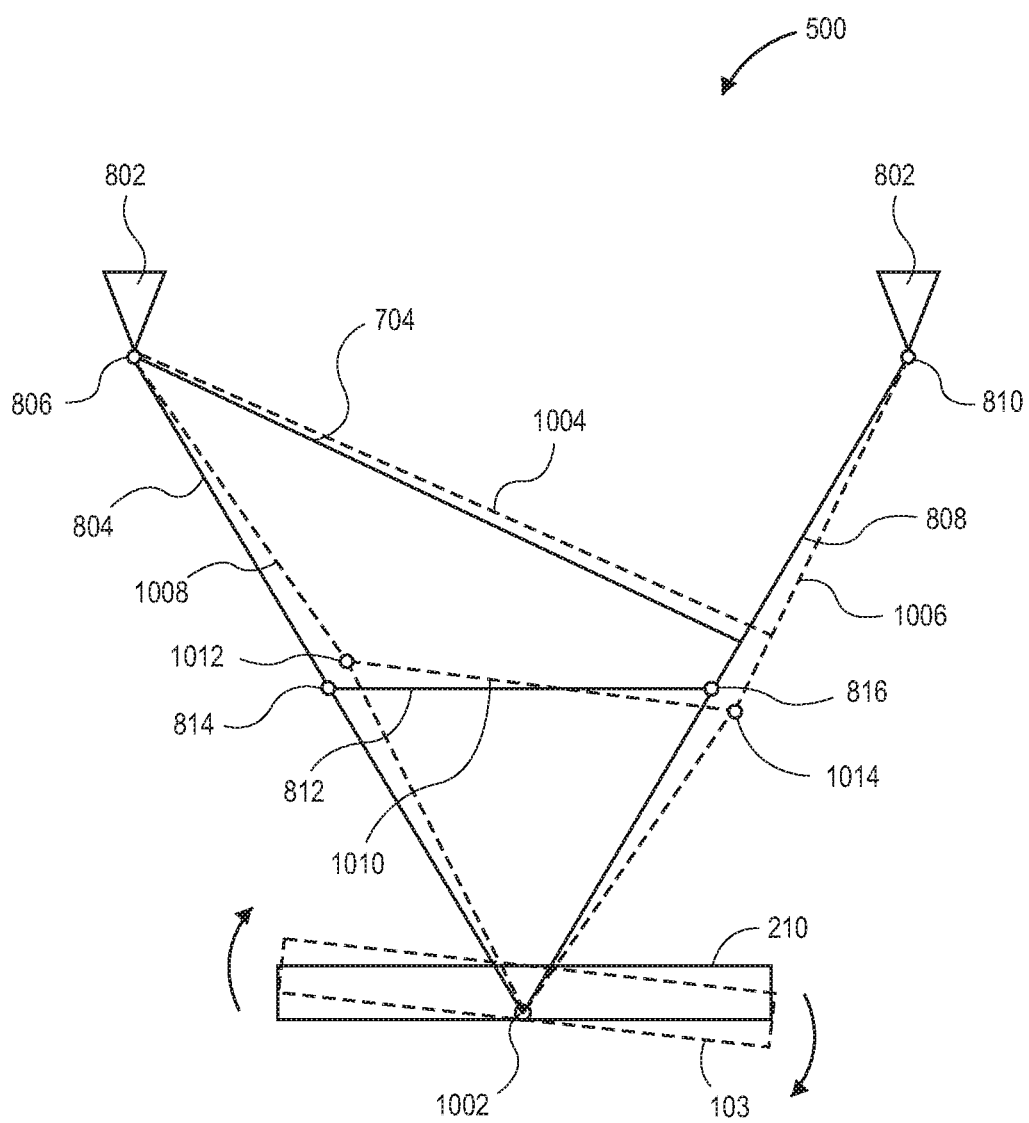
FIG. 10 is a schematic view of a remote center robot adjusting an orientation of a micro pick up array in accordance with an embodiment.

Referring to FIG. 10, a schematic view of a remote center robot adjusting an orientation of a micro pick up array is shown in accordance with an embodiment. In an embodiment, a remote rotational center 1002 represents a spatial location at which remote tipping center 826 associated with x-linkage 504 is coincident with remote tilting center 922 associated with y-linkage 506. More particularly, although remote tipping center 826 and remote tilting center 922 are independently located according to link arm geometries of x-linkage 504 and y-linkage 506, respectively, the x-linkage 504 and y-linkage 506 geometries may be symmetrically formed as described above to create a shared remote rotational center 1002. Furthermore, remote rotational center 1002 may be located at a surface of micro pick up array 103, e.g., at an electrostatic transfer head 203, such that movement of x-linkage 504 causes pure tipping rotation at the electrostatic transfer head 203 and movement of y-linkage 506 causes pure tilting rotation at the electrostatic transfer head 203. As a result, combined movement of x-linkage 504 and y-linkage 506 may cause pure rotation about the electrostatic transfer head 203 in any direction about z-axis 510, to prevent smearing of a micro device that is in contact with the electrostatic transfer head 203.

For ease of understanding, only x-linkage 504 movement is represented by FIG. 10. However, y-linkage 506 movement may be modelled identically since x-linkage 504 and y-linkage 506 may be symmetrically formed. X-linkage left link arm 804 is shown pivoting about x-linkage upper left joint 806 at x-linkage ground 802. Similarly, x-linkage right link arm 808 is shown pivoting about x-linkage upper right joint 810 at x-linkage ground 802. X-linkage coupler 812 spans between x-linkage lower left joint 814 and x-linkage lower right joint 816. As shown, x-linkage 504 is not overly constrained, and may be acted upon by an actuator of some kind to generate movement of the linkage structure. For example, x-actuator 704 may be a linear actuator with a first end fixed relative to x-linkage ground 802 and a second end fixed relative to x-linkage right link arm 808. As shown, x-actuator 704 may extend in length to cause x-linkage right link arm 808 to sway outward and cause x-linkage left link arm 804 to sway inward. More particularly, actuation of x-actuator 704 may move the actuator to an x-actuator 1004 orientation, accompanied by movement of x-linkage right link arm 808 to an x-linkage right link arm 1006 orientation and movement of x-linkage left link arm 804 to an x-linkage left link arm 1008 orientation. Alternatively, x-actuator 704 could be a lever, rotational motor, etc., to cause x-linkage left link arm 804, or another link, to pivot relative to x-linkage ground 802, or another link.

In an embodiment, movement of x-linkage 504 link arms is accompanied by a pivoting of x-linkage coupler 812 from an initial location to an x-linkage coupler 1010 orientation. More particularly, as x-linkage lower left joint 814 at one end of x-linkage coupler 812 moves to x-linkage lower left joint 1012 location and x-linkage lower right joint 816 at another end of x-linkage coupler 812 moves to x-linkage lower right joint 1014 location, x-linkage coupler 812 may pivot around remote rotation center 1002, which remains virtually fixed in space. Furthermore, given that micro pick up array 103 may be fixed relative to x-linkage coupler 812, the micro pick up array 103 may rotate around remote rotational center 1002 and an electrostatic transfer head 203 on micro pick up array 103 located at remote rotational center 1002 may experience pure rotation and/or minimal parasitic translational motion.

Figure 11:
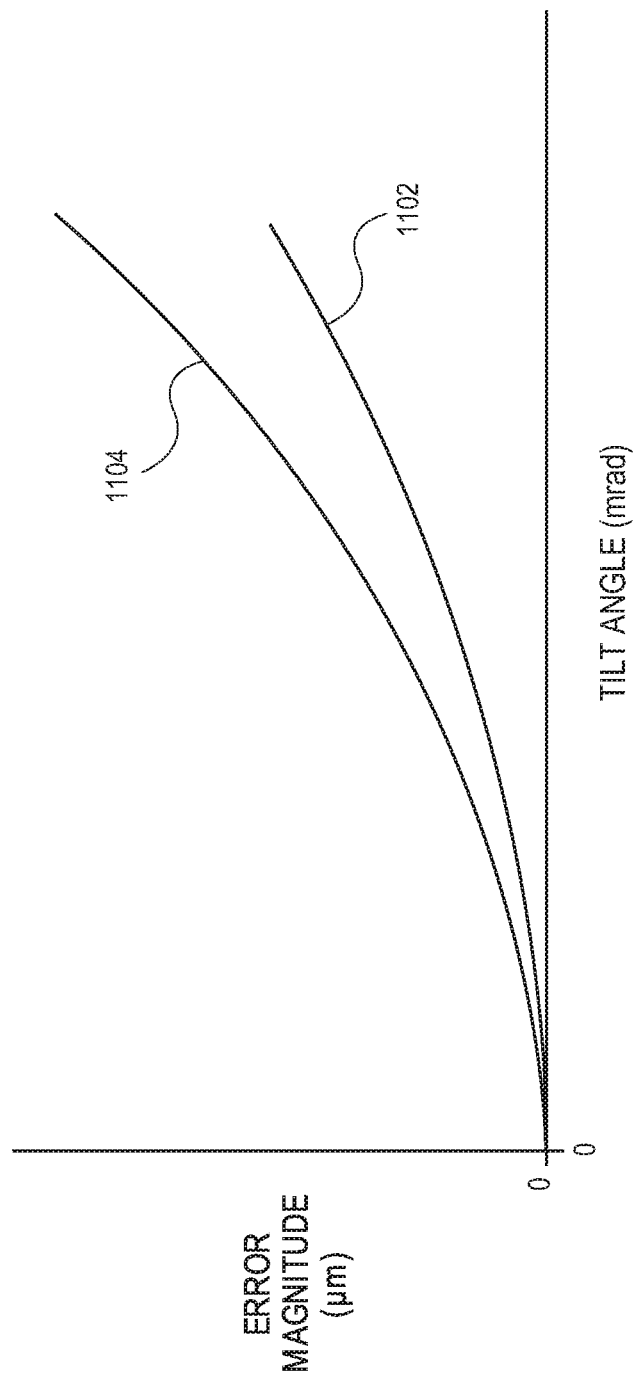
FIG. 11 is a graph of parasitic motion of a point of interest as a function of micro pick up array tilt angle in accordance with an embodiment.

Referring to FIG. 11, a graph of parasitic motion of a point of interest as a function of micro pick up array tilt angle is shown in accordance with an embodiment. By way of example and not limitation, x-actuator 704 may be a piezo actuator having a linear motion range of about 90 micron. In an embodiment, actuation of x-actuator 704 over the full range of motion may result in x-linkage right link arm 808 pivoting through an angular range of about 2 mrad toward x-linkage right link arm 1006 location. Furthermore, such actuation may cause a similar tipping of micro pick up array 103 about remote rotation center 1002, e.g., in the 2 mrad range.

In an embodiment, tipping or tilting of micro pick up array 103 about remote rotational center 1002 is accompanied by some degree of translational parasitic motion. For example, parasitic error 1102 may accompany tilting of y-linkage right link arm 908 under actuation of y-actuator 708. However, such parasitic error 1102 may be substantially reduced as compared to parasitic translation 408 inherent in existing manipulator assemblies. For example, whereas parasitic translation 408 discussed above may be in a range of several tens of microns, parasitic error 1102 using remote center robot 500 may be less than about 200 nm over the entire range of actuator motion. Thus, remote center robot 500 may provide for negligible lateral or vertical parasitic motion for small motions, e.g., motion less than about 5 mrad about a neutral position.

Although remote center robot 500 may reduce lateral parasitic translation 408, some degree of vertical movement of a point of interest may remain. For example, vertical error 1104, corresponding to a degree of vertical motion that an electrostatic transfer head 203 at remote rotational center 1002 experiences during movement of remote center robot 500, may accompany tipping or tilting of micro pick up array 103 about remote rotational center 1002. In an embodiment, vertical error 1104 using remote center robot 500 may be less than about 350 nm over the entire range of actuator motion. Nonetheless, remote center robot 500 may incorporate additional features to adjust for, and reduce, vertical error 1104.

Figure 12:
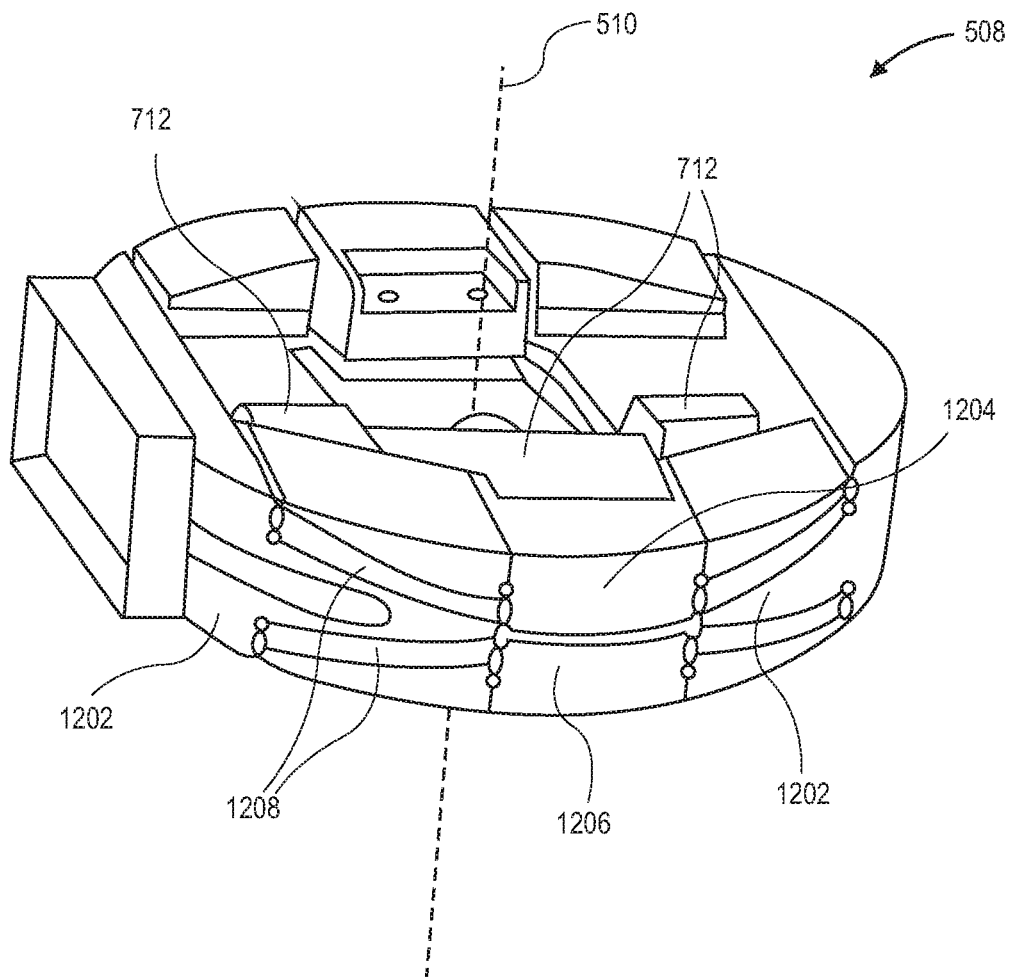
FIG. 12 is a perspective view of a z-flexure in accordance with an embodiment.

Referring to FIG. 12, a perspective view of a z-flexure is shown in accordance with an embodiment. In an embodiment, z-flexure 508 may provide z-correction to compensate for vertical error 1104. Z-flexure 508 may include a linkage structure that moves under actuation from z-actuator 712. More particularly, z-flexure 508 may lengthen and shorten along z-axis 510, and thus, a vertical location of an electrostatic transfer head 203 on micro pick up array 103 coupled with z-flexure 508 may be varied relative to mass transfer tool mount 306. Accordingly, an electrostatic transfer head position on micro pick up array 103 may be moved vertically during tipping or tilting of linkages to compensate for vertical error 1104 and maintain electrostatic transfer head 203 in a constant vertical position along z-axis 510.

In an embodiment, z-flexure 508 may have a generally annular shape such that a central opening is located along z-axis 510. The annular shape may have a height in an axial direction and include an outer diameter in a transverse direction relative to z-axis 510. Z-actuator 712 may be positioned inside of the central opening with a first end connected to a first lateral side of the annular shape and a second end connected to a second lateral side of the annular shape. Accordingly, z-actuator 712 may be lengthened or shortened such that the ends of z-actuator 712 apply a radial load on the annular shape, either outwardly or inwardly.

Radial loading of z-flexure 508 by z-actuator 712 may cause an axial change in height of the annular shape through a linkage structure formed in z-flexure 508. For example, z-flexure 508 may include one or more associated linkages having z-flexure 508 links, e.g., a wedge link 1202 and one or more intermediate links 1208. The z-flexure 508 links may form a double-back four-bar linkage with a range of motion within a single plane. More particularly, z-flexure 508 links may be rigid in a direction transverse to a plane encompassing z-actuator 712 and z-axis 510, such that actuation of z-flexure 508 provide a change in z-flexure 508 height between an upper mount 1204 and a lower mount 1206, but results in no lateral motion of upper mount 1204 or lower mount 1206. Thus, z-flexure 508 provides a structure that is essentially immune to lateral flexure, such that lower mount 1206 moves only in a vertical direction and imparts motion to an associated object, e.g., micro pick up array 103, only in the vertical direction.

In an embodiment, the z-flexure 508 linkage structure provides a relationship between wedge link 1202 position and a distance between upper mount 1204 and lower mount 1206. More particularly, wedge link 1202 may be part of the annular shape acted upon by z-actuator 712. Thus, as z-actuator 712 extends or retracts, e.g., in the case where z-actuator 712 is a linear actuator, wedge links 1202 may correspondingly move away from each other or toward each other. In either case, wedge links 1202 may be connected to each side of an upper mount 1204 and a lower mount 1206 through respective intermediate links 1208. Intermediate links 1208 may be link arms of a double-back four-bar linkage that move based on wedge link 1202 position. More particularly, as wedge links 1202 move inward, intermediate links 1208 may be pushed away from each other, causing upper mount 1204 to separate from lower mount 1206 and causing the entire annular shape to increase in height. Alternatively, as wedge links move outward, intermediate links 1208 may be drawn toward each other, causing upper mount 1204 and lower mount 1206 to also be drawn together and causing the entire annular shape to decrease in height. Thus, actuation of z-actuator 712 may result in an overall change in height of z-flexure 508.

In an embodiment, the structure of the z-flexure 508 linkage provides an amplification effect. For example, movement of z-actuator 712 may be amplified by a factor of about 5. Thus, in an embodiment, an increase in z-actuator 712 length of between 50-90 microns places a lateral load on the annular shape of z-flexure 508 that causes a distance between upper mount 1204 and lower mount 1206 to decrease by about 300 micron. Accordingly, an overall height of z-flexure 508 may be correspondingly reduced by about 300 micron. Z-flexure 508 height may be increased in a similar but opposite manner.

Figure 13:
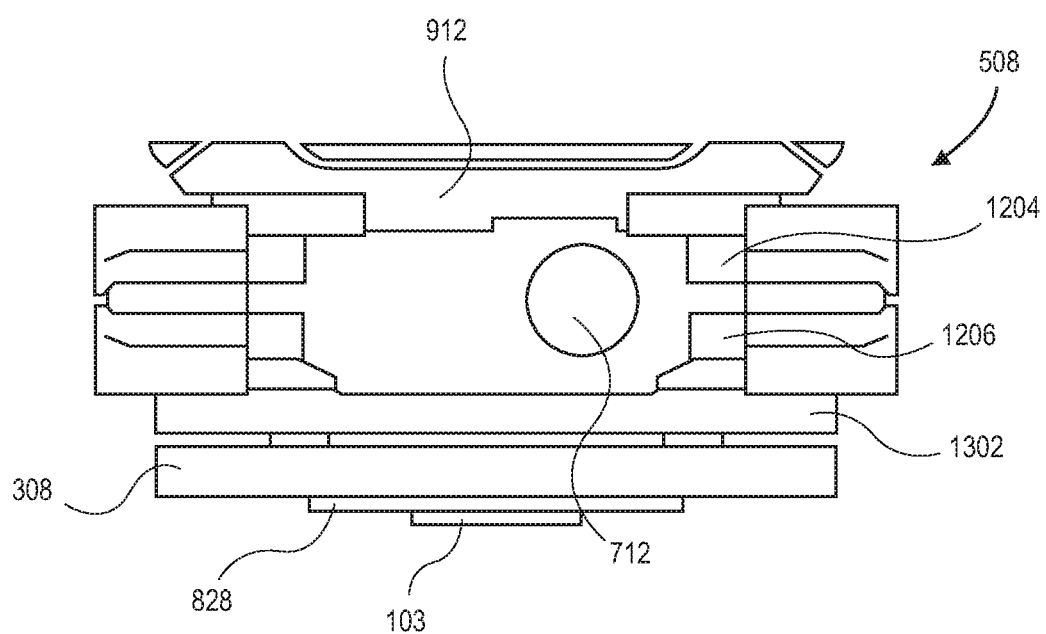
FIG. 13 is a cross-sectional view of a z-flexure in accordance with an embodiment.

Referring to FIG. 13, a cross-sectional view of a z-flexure is shown in accordance with an embodiment. Given that z-flexure 508 height may be adjusted through transverse loading from z-actuator 712, a vertical location of an electrostatic transfer head 203 on micro pick up array 103 may also be adjusted. More particularly, upper mount 1204 of z-flexure 508 may be connected to y-linkage coupler 912 and lower mount 1206 may be coupled to distribution plate 308, or optionally to insulator 1302. Furthermore, micro pick up array 103 may be connected with micro pick up array mount 828, which may be in turn be connected with distribution plate 308. Thus, as the distance between upper mount 1204 and lower mount 1206 varies, so may the distance between micro pick up array 103 and y-linkage coupler 912 vary. Accordingly, a vertical location of an electrostatic transfer head 203 on micro pick up array 103 may be varied to compensate for vertical error 1104 created by tipping and tilting of remote center robot 500 linkages.

Figure 14:
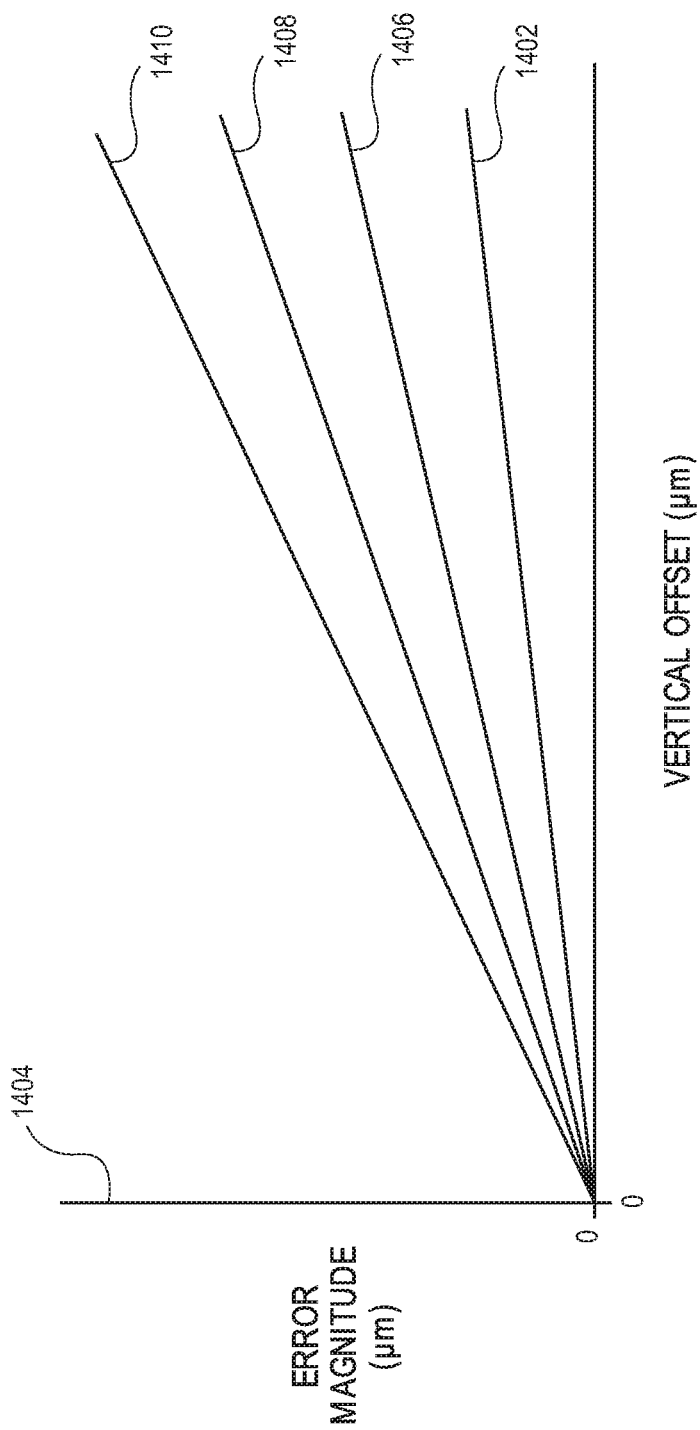
FIG. 14 is a graph of parasitic motion of a point of interest as a function of vertical offset between the point of interest and a remote rotational center in accordance with an embodiment.

Referring to FIG. 14, a graph of parasitic motion of a point of interest as a function of vertical offset between the point of interest and a remote rotational center is shown in accordance with an embodiment. It is now evident that lateral parasitic motion of a point of interest depends upon whether the point of interest is aligned with remote rotational center 1002. For example, as vertical distance between a point of interest, e.g., an electrostatic transfer head 203 on micro pick up array 103, and remote rotational center 1002 increases, so may parasitic error 1102 resulting from a given tip or tilt of remote center robot 500 linkages increase. For example, for a first angular position 1402 of micro pick up array 103 about remote rotational center 1002, e.g., about 0.5 mrad, parasitic error 1102 may increase by an additional parasitic error 1404 based on a given vertical offset. As the given vertical offset varies up to about 180 micron, the additional parasitic error 1404 for the first angular tip or tilt 1402 increase up to about 100 nm. Similarly, for higher tipping or tilting angles between micro pick up array 103 and remote rotational center 1002, e.g., second angular position 1406, third angular position 1408, and fourth angular position 1410, additional parasitic error 1404 may correspondingly increase for a given vertical offset of the point of interest relative to remote rotational center 1002. For example, in an embodiment, as vertical offset between the electrostatic transfer head 203 and remote rotational center 1002 varies up to about 180 micron and micro pick up array 103 tilts to fourth angular position 1410 of approximately 2 mrad, parasitic error 1102 may be increased by additional parasitic error 1404 of up to about 375 nm.

Numerous factors may lead to vertical offset between a point of interest and remote rotational center 1002. For example, thermal expansion of linkages during use may move remote rotational center 1002 relative to the point of interest. Accordingly, system features may be introduced to reduce thermal expansion of linkages. In an embodiment, insulator 1302 provides thermal and/or electrical insulation between micro pick up array 103 and z-flexure 508 or other components of remote center robot 500. Micro pick up array 103 may be heated during micro device transfer, and thus, insulator 1302 may protect structural and electronic components from thermal degradation. Furthermore, thermal insulation may reduce thermal expansion of remote center robot 500 linkages that would change linkage geometries and potentially change remote rotational center 1002 location relative to a target surface, e.g., an electrostatic transfer head 203. In a production environment, heating elements may be employed near micro pick up array 103 surface to facilitate micro device transfer. As a result, thermal expansion of link arms may be on the order of the movement of remote center robot 500 actuators, e.g., a 10 degree Celsius temperature change may cause a link arm length change of up to about 11 microns. This length change may cause a corresponding shift in remote rotational center 1002 location relative to a point of interest. Thus, insulator 1302 may be used to shield remote center robot 500 linkages from heating elements and reduce thermal expansion. In an embodiment, insulator 1302 may be a separate disk component fastened between distribution plate 308 and z-flexure 508. Alternatively, insulator 1302 may be integrated within distribution plate 308, e.g., distribution plate 308 may be formed from, or surrounded by, an insulating material. In any case, insulator 1302 may incorporate an insulating material, such as a ceramic material.

Other system and environmental variations, such as manufacturing tolerances inherent in the production of remote center robot 500, may lead to remote rotational center 1002 drift, and thus, features may be needed to maintain remote rotation center alignment with electrostatic transfer heads. In an embodiment, z-flexure 508 may be used to maintain alignment between a point of interest and remote rotational center 1002. For instance, if remote rotational center 1002 drifts downward due to thermal expansion of remote center robot 500 linkages, z-flexure 508 may be lengthened to extend micro pick up array 103 toward the relocated remote rotational center 1002 and maintain alignment between an electrostatic transfer head 203 and remote rotational center 1002.

The same factors that can cause remote rotational center 1002 to drift vertically relative to a point of interest may also lead to relative movement between remote tipping center 826 and remote tilting center 922. For example, even though the linkages of remote center robot 500 may be symmetric, thermal expansion of x-linkage 504 may not exactly match thermal expansion of y-linkage 506. Thus, either remote tipping center 826 or remote tilting center 922 may become misaligned with a point of interest, causing additional lateral parasitic motion in the direction of the misaligned center of rotation. Accordingly, it may be advantageous to incorporate features in remote center robot 500 to adjust for misalignment between remote tipping center 826 and remote tilting center 922 to allow both centers to simultaneously align with a point of interest.

Figure 15:
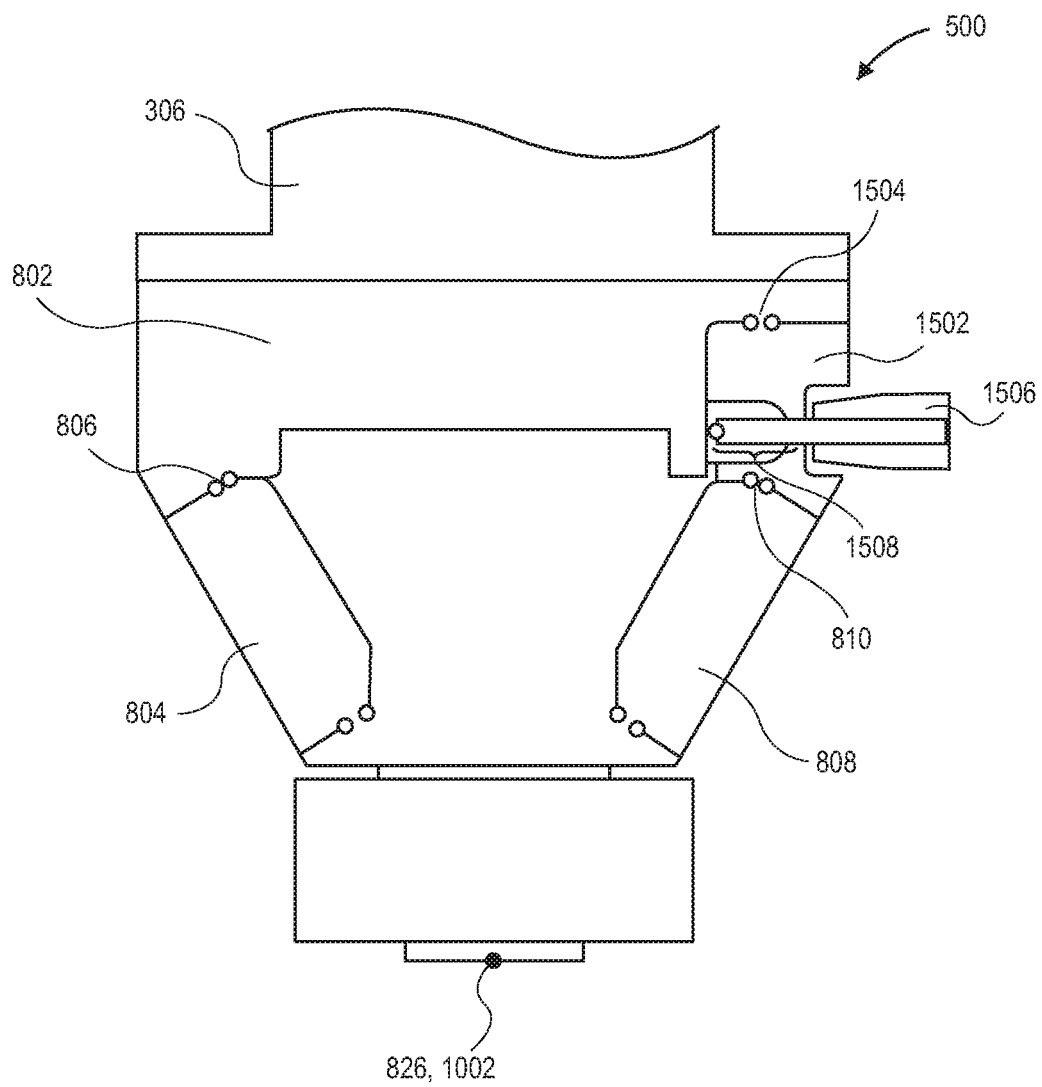
FIG. 15 is a cross-sectional plan view of an adjustment mechanism of a remote center robot in accordance with an embodiment.

Referring to FIG. 15, a cross-sectional plan view of an adjustment mechanism of a remote center robot is shown in accordance with an embodiment. Remote center robot 500 may include a mechanism to adjust x-linkage 504 geometry such that remote rotational center 1002 is formed. More particularly, x-linkage 504 geometry may be varied to adjust a vertical position of remote tipping center 826 along z-axis 510 such that remote tipping center 826 coincides with remote tilting center 922 to form remote rotational center 1002.

In an embodiment, an adjustment mechanism for altering x-linkage 504 geometry includes adjuster link 1502 connected between x-linkage ground 802 and x-linkage right link arm 808. More particularly, adjuster link 1502 may pivot relative to x-linkage ground 802 link at adjustment joint 1504, and adjuster link 1502 may pivot relative to x-linkage right link arm 808 at x-linkage upper right joint 810. Adjuster link 1502 provides an additional degree of freedom to x-linkage 504, and thus, an additional manner of adjusting x-linkage 504 geometry. More specifically, an adjuster actuator 1506 may alter adjuster link 1502 geometry. Adjuster actuator 1506 may have an adjuster rod length 1508 between an adjuster actuator 1506 end that contacts x-linkage ground 802 and an adjuster actuator 1506 portion fixed relative to adjuster link 1502. Adjuster actuator 1506 may be actuated to increase adjuster rod length 1508, and thus, cause adjuster link 1502 to be pushed away from x-linkage ground 802 and pivot about adjustment joint 1504. As adjuster link 1502 pivots away from x-linkage ground 802 link, x-linkage upper right joint 810 may also move outward, adjusting the relationship between the x-linkage 504 link arms, ground link, and coupler link described above. More particularly, a lateral distance between x-linkage upper right joint 810 and z-axis 510, or x-linkage upper left joint 806, may change in proportion to adjuster rod length 1508. Similarly, an angle between x-linkage right axis 820 and z-axis 510, or x-linkage left axis 818, may change in proportion to adjuster rod length 1508.

In an embodiment, rather than relying on an adjuster actuator 1506 to move adjuster link 1502, adjuster link 1502 may itself have a variable length that alters a distance between x-linkage upper right joint 810 and z-axis 510. For example, adjuster link 1502 may be a linear actuator, e.g., a piezoelectric linear actuator, having a first end and a second end with a variable distance therebetween. The first end of adjuster link 1502 may be coupled with adjuster joint 1504 at x-linkage ground 802, while the second end of adjuster link 1502 may be coupled with x-linkage upper right joint 810 at a location laterally offset from adjuster joint 1504. Thus, the second end may be laterally offset from z-axis 510. By way of example, adjuster link 1502 may be perpendicular to z-axis 510 between adjuster joint 1504 and x-linkage upper right joint 810. Adjuster link 1502 may thus be actuated to increase or decrease the distance between x-linkage upper right joint 810 and adjuster joint 1504, or z-axis 510. As the lateral distance is changed, the geometric relationships of x-linkage 504 may be varied, e.g., a first angle between x-linkage right link arm 808 and z-axis 510 may change, resulting in a repositioning of remote tipping center 826 along z-axis 510.

Figure 16A:
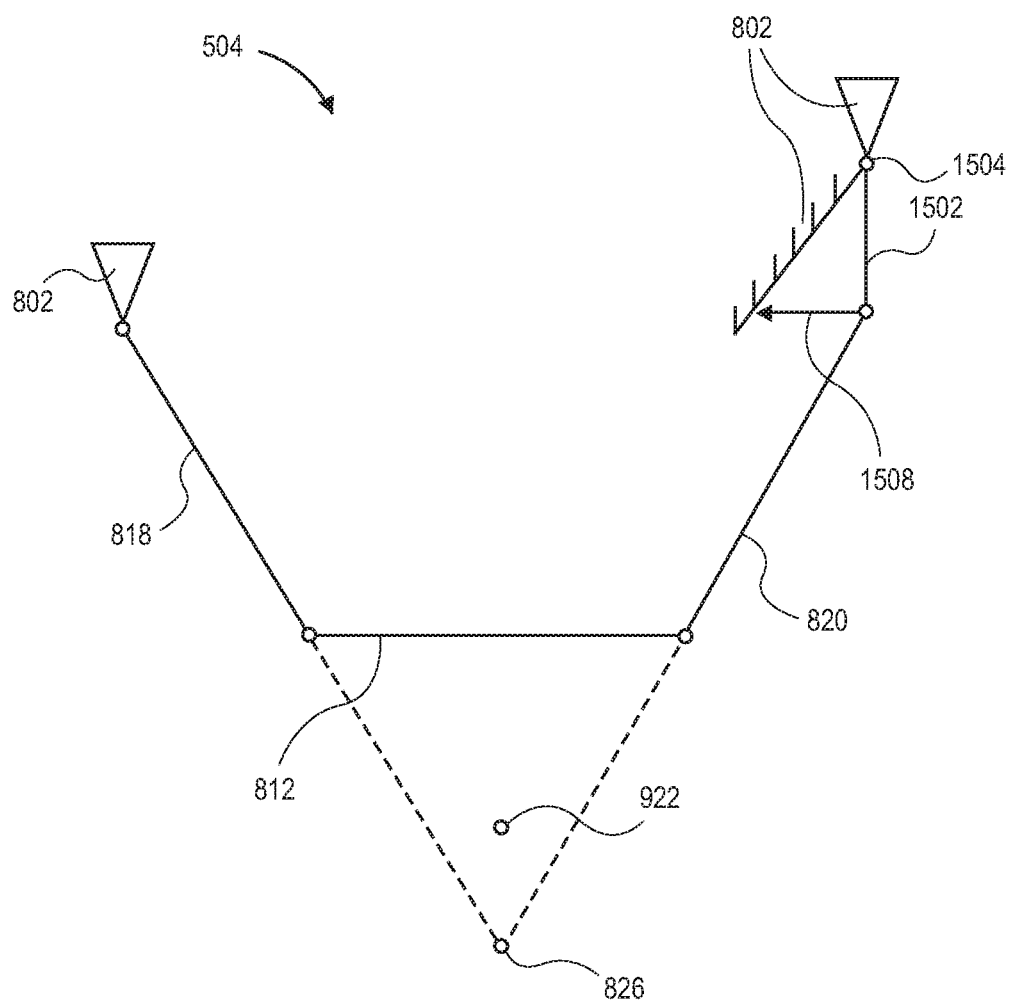
FIG. 16A-16B are a schematic view of an adjustment mechanism of a remote center robot adjusting a location of a remote tipping center in accordance with an embodiment.

Referring to FIG. 16A, a schematic view of an adjustment mechanism of a remote center robot adjusting a location of a remote tipping center 826 is shown in accordance with an embodiment. In an initial configuration, x-linkage 504 may include x-linkage left axis 818 and x-linkage right axis 820 that extend along the dashed lines to an intersection point at remote tipping center 826. Although not shown in FIG. 16A, y-linkage 506 includes similar geometry, e.g., symmetric with the geometry of x-linkage 504, however remote tilting center 922, which corresponds to an intersection between y-linkage left axis 918 and y-linkage right axis 920, may be vertically offset from remote tilting center 922. Such an offset may have numerous causes, including thermal expansion of link arms, manufacturing tolerance stack ups, or mechanical degradation of system components over time. The offset is exaggerated for illustration purposes, but in reality, the offset may be on the order of several microns. Such a small offset between remote tipping center 826 and remote tilting center 922 may nonetheless cause significant parasitic motion in the direction of movement of the linkage whose remote center is not located at the point of interest. Since such parasitic motion may result in damage to micro devices, in an embodiment, remote tipping center 826 and remote tilting center 922 may be adjusted to align with each other and be located at the point of interest.

Figure 16B:
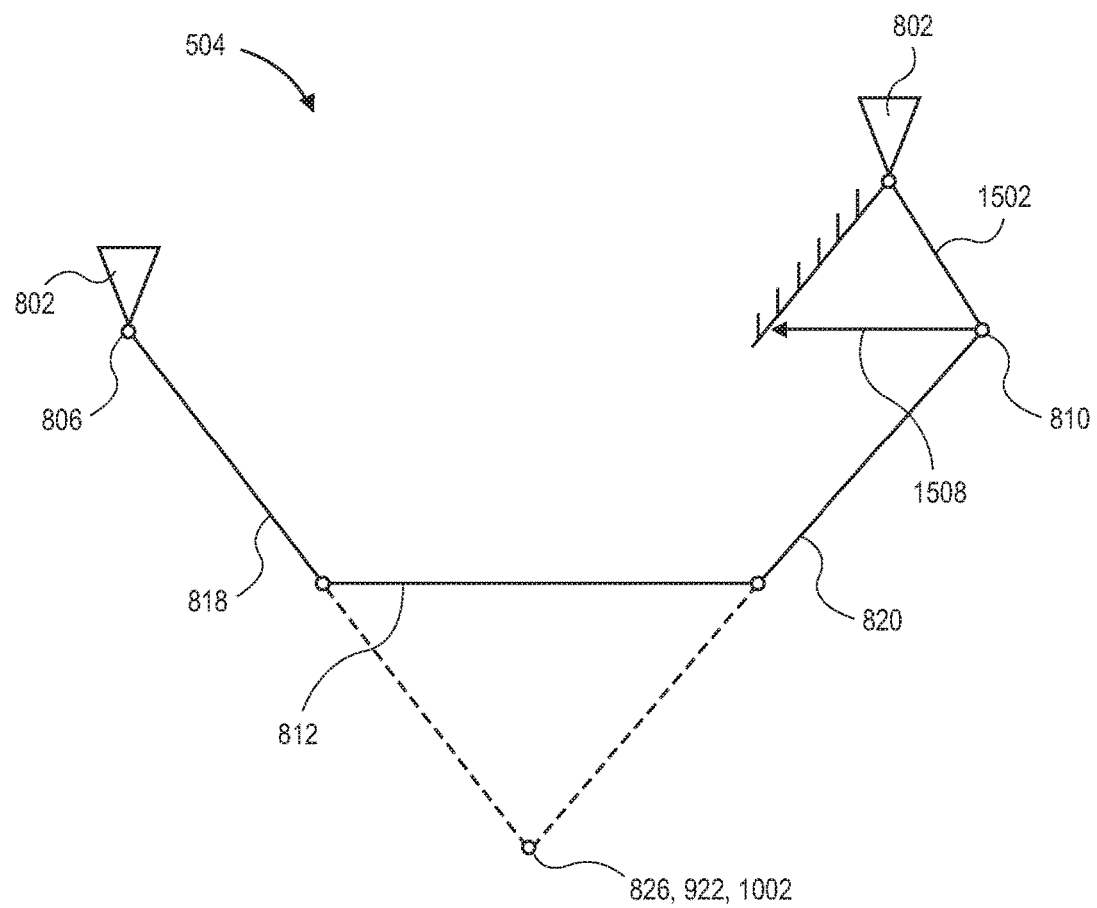

Referring to FIG. 16B, a schematic view of an adjustment mechanism of a remote center robot adjusting a location of a remote tipping center is shown in accordance with an embodiment. An adjustment mechanism may be used to alter x-linkage 504 geometry such that remote tipping center 826 is raised along z-axis 510 to align with remote tilting center 922 of y-linkage 506. Alignment of the remote centers creates a remote rotational center 1002—a point at which pure rotation may be experienced in any direction when x-linkage 504 and y-linkage 506 are moved.

In an embodiment, adjuster link 1502 is pivoted outward relative to x-linkage ground 802 by increasing adjuster rod length 1508. Adjuster rod length 1508 may correspond to a length of adjuster actuator 1506. For example, adjuster actuator 1506 may be a linear actuator, e.g., piezoelectric, pneumatic, linear motor, etc., that lengthens or shortens based on actuator loads controlled by computer 108. In an embodiment, adjuster actuator 1506 may include a manual micrometer having a thumb screw that may be rotated manually to cause a micrometer length to change, and thus, to increase or decrease a distance between x-linkage upper right joint 810 and z-axis 510, or x-linkage upper left joint 806. Thus, actuation of adjuster actuator 1506 may cause x-linkage right axis 820, which is geometrically coupled with x-linkage upper right joint 810, to splay outward such that an angle between x-linkage right axis 820 and z-axis 510 increases. Similarly, x-linkage left axis 818 may simultaneously splay to maintain symmetry of the angles between the x-linkage 504 link arms and z-axis 510. Accordingly, x-linkage coupler 812 may rise vertically, and remote tipping center 826 may be brought into alignment with remote tilting center 922. As discussed above, after aligning remote centers to create remote rotational center 1002, a location of remote rotational center 1002 may be aligned with a point of interest, such as an electrostatic transfer head 203 on micro pick up array 103, by adjusting a vertical position of micro pick up array 103 until the point of interest is located at the remote rotational center 1002. Z-correction enabled by z-flexure 508 may be used to vertically adjust the point of interest to coincide with remote rotational center 1002.

In an embodiment, a control loop may be closed to achieve the goal of evenly distributing pressure across micro pick up array 103. More particularly, the control loop may process a combination of position and stress inputs to move micro pick up array 103 toward a desired stress state, e.g., to evenly distribute pressure across micro pick up array 103. Stress inputs may correspond to strain signals provided from strain gauges mounted on micro pick up array 103. Alternatively, micro pick up array mount 828 may adapt micro pick up array 103 to distribution plate 308 and provide feedback signals corresponding to a stress state of micro pick up array 103. Thus, micro pick up array 103 may be reoriented to distribute a pressure gradient across a surface of micro pick up array 103 in a predetermined manner. For example, micro pick up array 103 may be reoriented until a magnitude or direction of the pressure gradient across the surface of micro pick up array 103 is a predetermined value.

Figure 17:
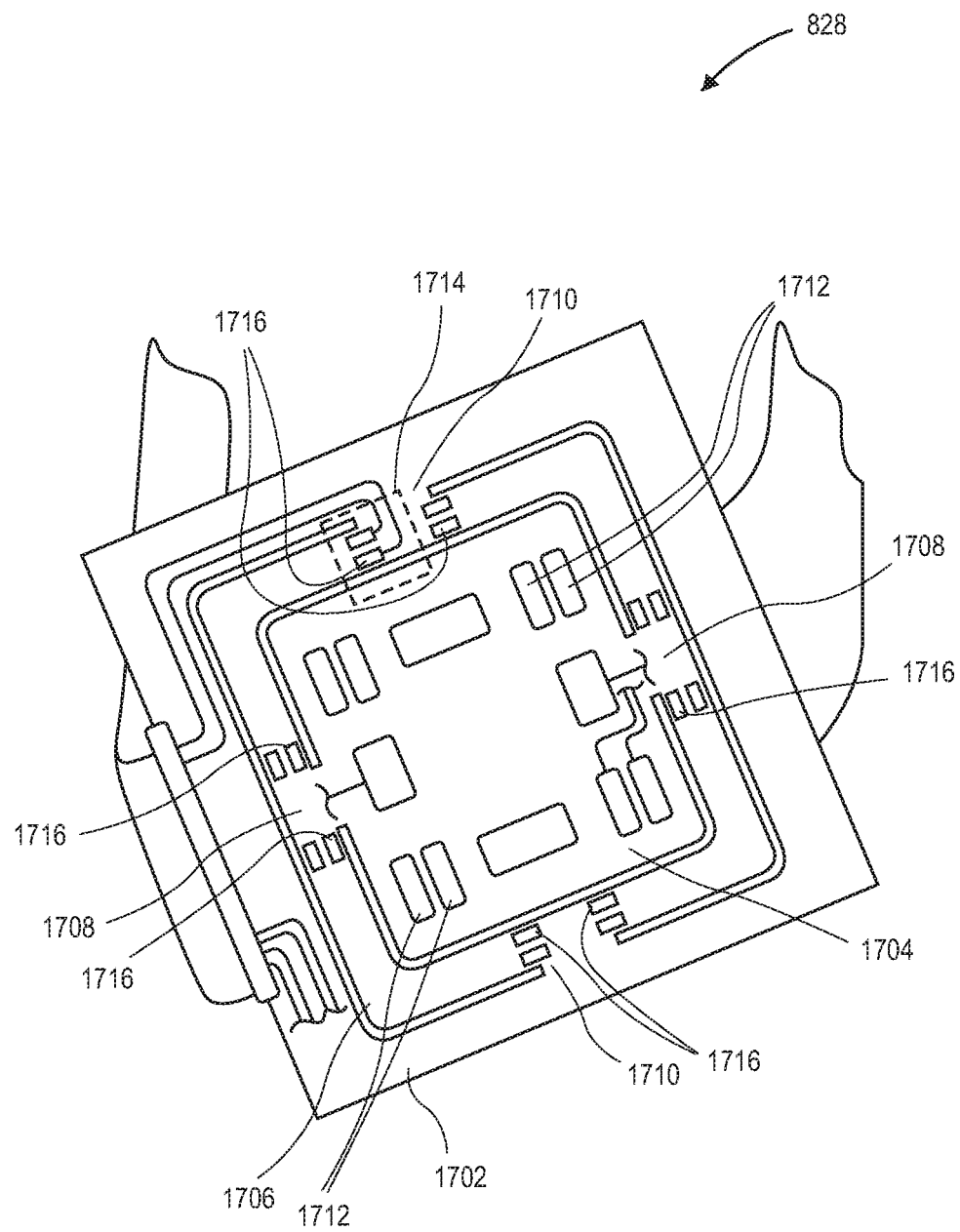
FIG. 17 is a perspective view of a micro pick up array mount in accordance with an embodiment.

Referring to FIG. 17, a perspective view of a micro pick up array mount is shown in accordance with an embodiment. Micro pick up array 103 may be fixed to micro pick up array mount 828, and micro pick up array mount 828 may include sensors and/or transducers to provide feedback related to a pressure distribution, e.g., a magnitude or direction of a gradient of pressure, throughout micro pick up array mount 828.

For the purpose of reference, the illustrated view may be referred to as a "first side" of micro pick up array mount 828. In an embodiment, micro pick up array mount 828 includes base 1702 and pivot platform 1704. Base 1702 and pivot platform 1704 may be interconnected by one or more compliant elements. For example, in the illustrated embodiment, a compliant element may be represented by beam 1706, which may connect with base 1702 and pivot platform 1704 at one or more pivot locations, such as inner pivots 1708 and outer pivots 1710.

In an embodiment, the lateral extension of beam 1706 around pivot platform 1704 provides a lever arm that allows for bending and torsion in beam 1706, inner pivots 1708, and outer pivots 1710 when forces are applied to pivot platform 1704 or to micro pick up array 103 mounted on pivot platform 1704. More specifically, micro pick up array 103 may be electrostatically clamped to micro pick up array mount 828 at clamp electrodes 1712, and thus, when a force is applied to pivot platform 1704, such as when an electrostatic transfer head 203 on a mounted micro pick up array 103 contacts a micro device on a carrier substrate, pivot platform 1704 may deflect relative to base 1702. This deflection may be accompanied by the development of one or more high strain areas, as represented by dotted line region 1714, near outer pivots 1710. Similar strain regions may develop near inner pivots 1708 depending on the location that force is applied to pivot platform 1704.

In an embodiment, one or more displacement sensors 1716 may be integrated with beam 1706 at or near a high strain area. Displacement sensors 1716 may be capable of sensing beam 1706 displacement resulting from loads applied to portions of micro pick up array mount 828, such as pivot platform 1704. For example, displacement sensors 1716 may detect movement of beam 1706 directly, or may detect internal deformation to infer movement of beam 1706.

Based on feedback from displacement sensors 1716, remote center robot 500 may adjust a geometry of x-linkage 504, y-linkage 506, and/or z-flexure 508 to tip, tilt, or vertically move micro pick up array 103 until a desired amount of and/or a desired distribution of pressure across micro pick up array 103 is sensed by micro pick up array mount 828 sensors. Thus, remote center robot 500 may facilitate active alignment of an array of electrostatic transfer heads 203 on micro pick up array 103 with an array of micro devices on a mating substrate. Alignment within the scope of this description may include a spatial orientation between an array of electrostatic transfer heads 203 on micro pick up array 103 and an array of micro devices on a mating substrate. For example, the spatial orientation representing alignment may be predetermined to include a plane passing through the array of electrostatic transfer heads 203 being parallel to a plane passing through the array of micro devices. Alternatively, the spatial orientation representing alignment may include the planes not being parallel, but rather, being in some predetermined mutual orientation, such as angled such that only a portion of the array of electrostatic transfer heads 203 make contact with respective micro devices when the arrays are brought together. More particularly, the spatial orientation representing alignment of the array of electrostatic transfer heads 203 with the array of micro devices, may be any predetermined spatial orientation. Such spatial orientation may be monitored, sensed, and measured to determine system characteristics such as distribution of pressure across micro pick up array 103. Thus, the measured system characteristics may be used as a proxy to represent alignment. Active alignment may increase the transfer rate of micro devices, since fine-alignment may be accomplished while picking up, and similarly while releasing, the micro devices. Furthermore, since the array of electrostatic transfer heads 203 may be co-located with remote rotational center 1002, active alignment may be made on-the-fly without parasitic translation of the array of electrostatic transfer heads 203 that may otherwise smear and damage the array of micro devices. Such on-the-fly adjustments may be useful when a donor substrate, e.g., carrier substrate, and/or a display substrate, e.g., receiving substrate, include surface irregularities and non-planar contours.

Figure 18:
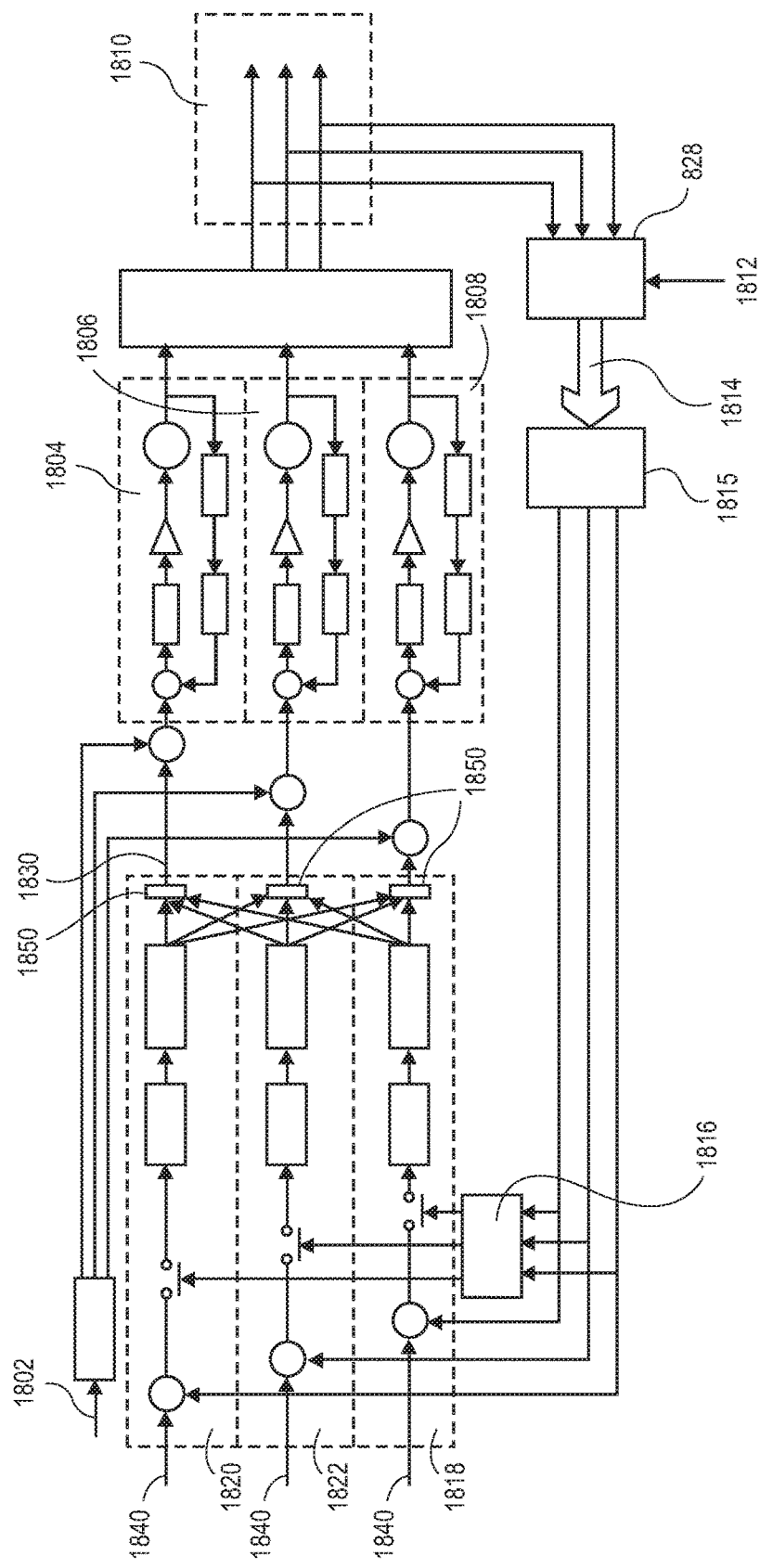
FIG. 18 is a schematic illustration of a control scheme for regulating a remote center robot in accordance with an embodiment.

Referring to FIG. 18, a schematic illustration of a control scheme for regulating a remote center robot is shown in accordance with an embodiment. More particularly, the control loop may include multiple sub-loops that process a combination of position and stress inputs. The actuators of remote control robot may be driven by the sub-loops, first toward an initial desired location, and if contact between micro pick up array 103 and a target substrate is sensed, then the initial desired location may be modified to move micro pick up array 103 toward a desired stress state, e.g., to evenly distribute pressure across micro pick up array 103 and/or to achieve a desired level of pressure at one or more locations on micro pick up array 103 based on a deflection of micro pick up array mount 828 compliant elements.

A primary input 1802 may define a set of reference signals that correspond to an initial desired state of micro pick up array 103. More specifically, primary input 1802 may define a target spatial location of micro pick up array mount 828. Primary input 1802 may correspond to x-linkage 504 and y-linkage 506 being symmetric about z-axis 510 with coupler links orthogonal to z-axis 510. Furthermore, primary input 1802 may define a location along z-axis 510 toward which micro pick up array 103 is intended to be moved. For example, primary input 1802 may command z-flexure 508 to extend and bring micro pick up array 103 toward an anticipated location of a micro device array or substrate surface.

Primary input 1802 may be fed into one of several inner loops, each of which may correspond to an individual actuator. For example, x-actuator inner loop 1804 may correspond to a control loop for controlling x-actuator 704 to cause x-linkage coupler 812, and thus micro pick up array 103, to tip about remote rotational center 1002. Similarly, y-actuator inner loop 1806 may correspond to a control loop for controlling y-actuator 708 to cause y-linkage coupler 912, and thus micro pick up array 103, to tilt about remote rotational center 1002. Also, z-actuator inner loop 1808 may correspond to a control loop for controlling z-actuator 712 to change a height of z-flexure 508, and thus a location of micro pick up array 103 along z-axis 510. Therefore, the combination of inner loops allow for the control of actuators that adjust a tip, tilt, and z-spatial orientation of micro pick up array 103 relative to mass transfer tool mount 306.

In an embodiment, inner loop control of remote center robot 500 actuators results in a primary output 1810. More specifically, primary output 1810 may be an instantaneous geometric configuration of remote center robot 500 resulting from actuator movement. The geometric configuration may be inferred from data supplied by encoders or other sensors that track spatial position of individual remote center robot 500 components. That is, the geometric configuration may include a combination of individual geometric configurations for each remote center robot 500 linkage. For example, primary output 1810 may include a tip position related to a geometric configuration of x-linkage 504 links, a tilt position related to a geometric configuration of y-linkage 506 links, and a z-position related to a height of z-flexure 508.

Primary output 1810 may also relate to a spatial position of micro pick up array mount 828 as inferred from known physical dimensions of remote center robot 500 components. For example, whereas encoder signals included in primary output 1810 may define a spatial position and orientation of a lower surface of z-flexure 508, e.g., lower mount 1206, a spatial position and orientation of micro pick up array mount 828 may be inferred through known physical dimensions of insulator 1302 and distribution plate 308 between micro pick up array mount 828 and lower mount 1206. Alternatively, micro pick up array mount 828 surface location may be sensed directly using, e.g., laser micrometers, accelerometers, etc., to provide spatial orientation feedback that may be included directly in primary output 1810. Thus, a position of micro pick up array mount 828 may be inferred or sensed to determine whether primary output 1810 has been achieved, i.e., equals the intended primary input 1802. However, although micro pick up array mount 828 may be driven toward a target substrate to achieve the positional command of primary input 1802, in some cases, micro pick up array mount 828 may contact the target substrate. Furthermore, once contact is detected, primary input 1802 may be modified by additional commands from several actuator outer loops, to achieve a neutral tip and tilt deformation of micro pick up array mount 828 with a desired pressure distribution across micro pick up array mount 828. Accordingly, micro pick up array 103 may be driven to a tip deflection, tilt deflection, and z-compression target within an accuracy in the submicron range, e.g., on the order of less than about 250 nm.

After contact between an electrostatic transfer head 203 and a micro device has been made, micro pick up array mount 828 may be finely adjusted based on pressure feedback from micro pick up array mount 828. More particularly, fine adjustment of micro pick up array mount 828 may be enabled in response to system recognition of a contact disturbance 1812. In an embodiment, enable logic is included to determine whether a contact disturbance 1812 is sensed prior to primary output 1810 achieving the desired primary input 1802, and if a contact disturbance 1812 is sensed, additional control loops may be closed to permit fine adjustment of remote center robot geometries. More specifically, additional control loops may be closed to drive micro pick up array mount 828 toward tip deflection, tilt deflection, and z-compression targets, rather than toward the initial positional target of primary input 1802.

In an embodiment, a contact disturbance 1812 is sensed when, e.g., micro pick up array 103 contacts a mating substrate out of alignment. For example, if micro pick up array 103 and the mating substrate make contact in perfect alignment, the primary output 1810 may equal the primary input 1802 and micro devices may then be gripped by electrostatic transfer heads 203 without requiring additional adjustment. However, if micro pick up array 103 and the mating substrate are not perfectly aligned, displacement or strain measurements from each sensor on micro pick up array mount 828 may be substantially different from each other and/or the desired level of pressure may not be achieved. That is, in an embodiment, an expected or desired tip, tilt, and compression state must be satisfied prior to initiating electrostatic gripping. If the desired state is not achieved, displacement or strain measurements may be fed as feedback signals 1814.

In an embodiment, feedback signals 1814 correspond to signals from separate sensors that monitor a physical state of micro pick up array mount 828. For example, laser, proximity, or other distance sensors may monitor a position of different surface locations on micro pick up array mount 828. Those distances may be correlated to a physical orientation of a portion of micro pick up array mount 828 surface. Alternatively, in an embodiment, a plurality of strain gauges, e.g., displacement sensors 1716, are distributed across a surface of micro pick up array mount 828. Each of the strain gauges may sense a strain state and output a corresponding analog signal. For example, feedback signals 1814 may include eight analog signals from eight separate strain gauges. The feedback signals 1814 may be conditioned by a signal conditioning and combination logic 1815 to transform the analog signals into a signal representing a strain state of a respective strain gauge. These conditioned signals may furthermore be combined by signal conditioning and combination logic 1815 to synthesize one or more of a micro pick up array mount 828 compression signal, a micro pick up array mount 828 tilt deflection signal, and a micro pick up array mount 828 tip deflection signal. The synthesized compression and deflection signals may be provided as inputs to dynamic control enable logic 1816. More particularly, dynamic control enable logic 1816 may observe the one or more synthesized signals to determine that a contact disturbance 1812 has occurred in one or more of a tip, tilt, or z-direction. For example, if a non-zero compression signal is synthesized by signal conditioning and combination logic 1815 that exceeds predetermined limits, dynamic control enable logic 1816 may recognize the contact disturbance 1812.

In response to observing that a contact disturbance 1812 exists, dynamic control enable logic 1816 may close respective outer loops, each of which may be configured to provide output commands to modify the positional command of primary input 1802. Thus, closing the outer loops may drive the actuators to achieve a desired state of pressure and orientation, rather than driving them to achieve an initial position command. For example, if dynamic control enable logic 1816 observes that a compression contact disturbance 1812 exists, z-actuator outer loop 1818 may be closed to respond to the contact disturbance 1812 by adjusting z-actuator 712. Likewise, dynamic control enable logic 1816 may respond to tip deflection signals or tilt deflection signals by enabling x-actuator outer loop 1820 or y-actuator outer loop 1822, respectively.

Deflection and compression feedback signals may be passed from signal conditioning and combination logic 1815 to respective outer loops for comparison with deflection command inputs 1840 provided to respective outer loops. In an embodiment, micro pick up array mount 828 deflection command inputs 1840 may correspond to a desired pressure distribution across micro pick up array mount 828 or micro pick up array 103. Thus, micro pick up array mount 828 deflection command inputs 1840 may represent tip deflection, tilt deflection, and z-compression targets of micro pick up array mount 828. These targets may be compared to the synthesized compression and deflection feedback signals from signal conditioning and combination logic 1815, which indicate an instantaneous pressure distribution across micro pick up array mount 828, to determine a difference. The difference, if any, may then be fed as an error signal to drive respective remote center robot 500 actuators. For example, if tipping of micro pick up array mount 828 is sensed as a contact disturbance 1812 and dynamic control enable logic 1816 observes that the tipping exceeds an allowable amount, x-actuator outer loop 1820 may be closed and the tipping deflection signal may be compared with a micro pick up array mount 828 tip deflection command 1840 to generate a motion control signal that will tip micro pick up array mount 828 toward a desired stress state. The motion control signal may be fed to a servo filter and passed through inverse kinematics calculations to generate an outer loop command output 1830. In an embodiment, the motion control signal may also be added with other remote center robot motion control signals at one or more of motion summation nodes 1850. This may be the case, for example, when movement of both x-linkage and y-linkage actuators is required to cause tipping.

In order to close the control loop, the outer loop command outputs 1830 may be combined with primary input 1802 and passed back into actuator inner loops. For example, a tipping outer loop command 1830 may be summed with primary input 1802 for x-linkage 504 and passed through x-actuator inner loop 1804, thereby controlling x-actuator 704 in such a manner that x-linkage 504 tips micro pick up array mount 828 toward a physical state of more even pressure distribution. Respective outer loop commands may be passed through to any actuator inner loop for which a contact disturbance 1812 was sensed.

The above control methodology may be performed and repeated until the remote center robot 500 is moved to a location at which pressure distribution across micro pick up array mount 828, and hence micro pick up array 103, is uniform and achieves a desired amount of pressure. Thus, remote center robot 500 may be controlled to bring an array of electrostatic transfer heads 203 on micro pick up array 103 into contact with an array of micro devices on a mating substrate. Using the control system described above, if alignment between micro pick up array 103 and the mating substrate is not initially perfect, which would be true of almost every transfer operation, pressure distribution control may be implemented to fine tune the alignment. The control methodology may be performed quickly, e.g., on the order of about 50 ms to sense a contact disturbance 1812, enable the appropriate outer loop(s), and feed appropriate outer loop control commands to actuators, and thus, complete contact may be rapidly achieved between an array of electrostatic transfer heads 203 and an array of micro devices, enabling efficient transfer between a carrier substrate and a receiving substrate.

Although FIG. 18 provides control loops for managing geometry of x-linkage 504, y-linkage 506, and z-flexure 508, additional control loops may be added to control other linkages and mechanisms of remote center robot 500. For example, an additional control loop may be used to control adjuster actuator 1506 in an embodiment that includes a remote rotational center 1002 position adjustment mechanism, such as the mechanism described with respect to FIGS. 15-16B. Although adjuster actuator 1506 may be adjusted manually prior to beginning a transfer operation, such as via a manual micrometer adjustment, adjuster link 1502 geometry may also be controlled on-the-fly using an automated actuator, such as a piezoelectric actuator. Automated actuation of adjuster link 1502 may allow for on-the-fly adjustment of remote rotational center 1002 to compensate for thermal expansion, deformation due to external loads, etc.

Such adjustment may also be used to compensate for z-flexure 508 adjustment of micro pick up array 103 along z-axis 510. For example, the automated adjuster actuator 1506 may be controlled based on z-flexure 508 movement. In an embodiment, if z-actuator inner loop 1808 moves z-flexure 508 a given amount, an adjuster actuator 1506 simultaneously adjusts adjuster actuator 1506 to move adjuster link 1502 in a manner that moves remote tipping center 826 along z-axis 510 by the same amount. A similar adjustment mechanism may be implemented for y-linkage 506 to also allow for on-the-fly adjustment of remote tilting center 922. Accordingly, both remote tipping center 826 and remote tilting center 922 may be simultaneously adjusted to move remote rotational center 1002 in unison with z-flexure 508 movement of micro pick up array 103. Thus, remote rotational center 1002 may coincide with a point of interest at all times.

Figure 19:
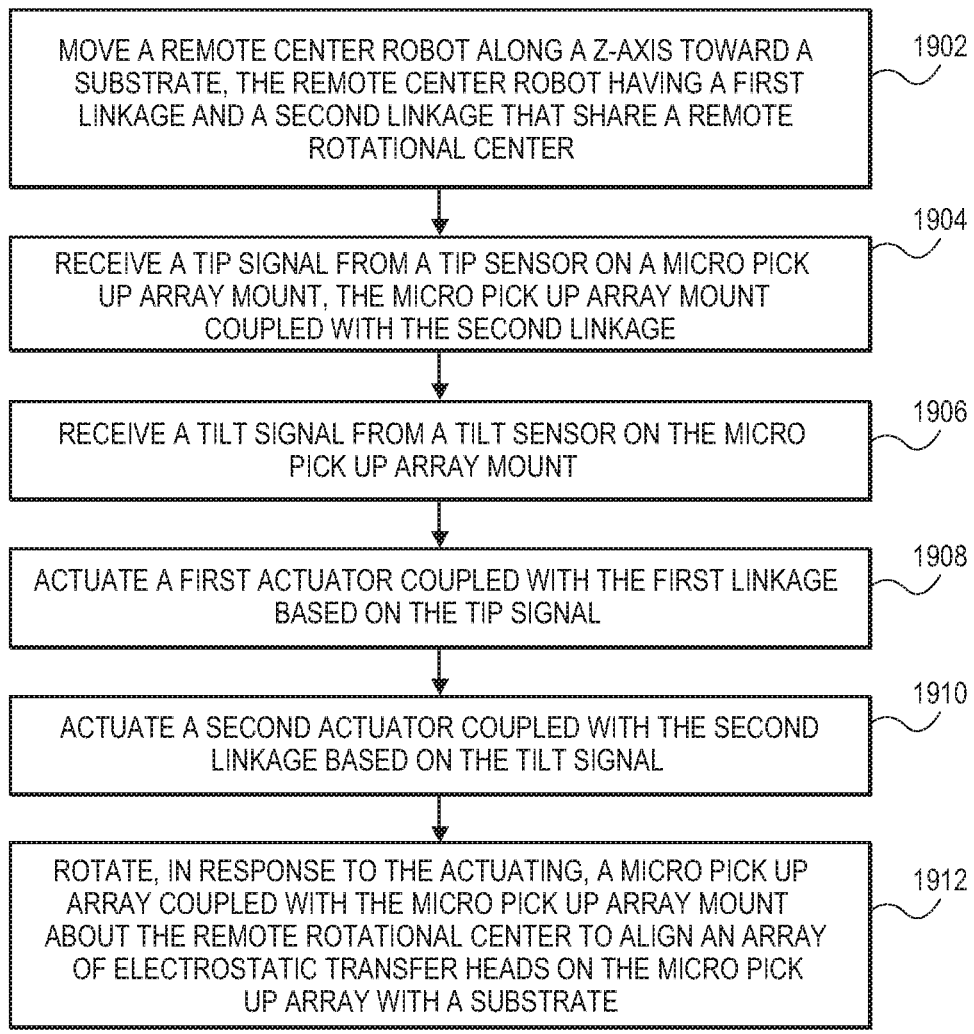
FIG. 19 is a flowchart illustrating a method of aligning a micro pick up array coupled with a remote center robot relative to a target substrate in accordance with an embodiment.

Referring to FIG. 19, a flowchart illustrating a method of aligning a micro pick up array coupled with a remote center robot relative to a target substrate is shown in accordance with an embodiment. The method may be performed, e.g., during a pick-up or a placement operation as micro devices are transferred from a carrier substrate to a receiving substrate. At operation 1902, mass transfer tool 100 moves remote center robot 500 along z-axis 510 toward a target substrate, e.g., carrier substrate held by carrier substrate holder 104 or receiving substrate held by receiving substrate holder 106, according to primary input 1802. More specifically, micro pick up array 103 held on micro pick up array mount 828 may be moved toward the target substrate along z-axis 510. Movement of micro pick up array 103 along z-axis 510 may be achieved by adjusting z-flexure 508 height, or by actuating various actuators of mass transfer tool 100, such as a vertical actuator associated with mass transfer tool mount 306 or a substrate holder.

Initially, remote center robot 500 may be in a neutral position, having x-linkage 504 symmetric with y-linkage 506. Furthermore, there may be no compressive loading applied to micro pick up array 103 or micro pick up array mount 828. This initial state may correspond to a range of travel over which array of micro devices are physically separated from array of electrostatic transfer heads. During this travel, micro pick up array 103 and the target substrate may have misaligned surfaces, but there may be no indication of this misalignment since the pressure distribution state of micro pick up array mount 828 may be uniform, i.e., all strain gauges may be outputting signals indicating zero strain.

At operation 1904, an electrostatic transfer head 203 may contact a micro device while other electrostatic transfer heads 203 may remain separated from corresponding micro devices. That is, contact may be made while micro pick up array 103 is misaligned with the target substrate. This positional misalignment may be sensed as uneven pressure distribution in micro pick up array mount 828. For example, a first strain output value from one strain gauge on micro pick up array mount 828 and a different second strain output value from another strain gauge on micro pick up array mount 828 may differ. The strain signals may be provided as feedback signals 1814 and conditioned and combined by into tip deflection, tilt deflection, and compression signals. Dynamic enable control logic 1816 may receive the deflection and compression signals, e.g., a tip deflection signal from a tip sensor on micro pick up array mount 828. As described above, the tip deflection signal from the tip sensor may actually be a combination of signals from multiple strain gauges, and thus reference to a singular sensor here is not intended to be limiting. For example, at operation 1906, a plurality of signals from strain gauges on micro pick up array mount 828 may be conditioned and combined by signal conditioning and combination logic 1815 into a tilt deflection signal indicating a contact disturbance 1812.

Dynamic enable control logic 1816 may observe that the contact disturbance 1812 exists, and depending upon the level of contact disturbance 1812, may activate actuator outer loops to determine driving signals for actuating various actuators of remote center robot 500 in order to adjust an orientation of micro pick up array 103 such that pressure distribution across micro pick up array mount 828 is uniform. For example, at operation 1908, in response to the tip signal being recognized as a contact disturbance 1812 above a threshold, x-actuator outer loop 1820 may feed command signals 1830 to x-actuator inner loop 1804 in order to actuate x-actuator 704 and move x-linkage 504 such that x-linkage coupler 812 tips about remote rotational center 1002. Similarly, at operation 1910, in response to the tilt deflection signal being recognized as a contact disturbance 1812 above a threshold, y-actuator outer loop 1822 may feed command signals to y-actuator inner loop 1806 in order to actuate y-actuator 708 to move y-linkage 506 such that y-linkage coupler 912 tilts about remote rotational center 1002.

At operation 1912, in response to actuation of x-actuator 704 and y-actuator 708 based on the tip deflection signal and the tilt deflection signal, micro pick up array 103 may be rotated into alignment with the target substrate. Furthermore, with remote rotational center 1002 co-located with the contact surface of micro pick up array 103, electrostatic transfer heads 203 on micro pick up array 103 may experience pure rotation about remote rotational center 1002. Thus, as micro pick up array 103 is aligned with the target substrate, the electrostatic transfer heads 203 may experience minimal parasitic lateral motion and micro devices may remain undamaged.

Actuation of remote center robot 500 according to tip, tilt, and z-compression signals may continue until electrostatic transfer heads 203 on micro pick up array 103 are in contact with micro devices on the target substrate. More particularly, actuation may continue until primary output 1810 is within the limits set by primary input 1802, at which point actuation may be stopped. As discussed above, primary output 1810 may be a positional output that is modified to reach a desired micro pick up array mount 828 state. For example, actuation of remote center robot 500 may continue until primary positional input is achieved and/or pressure distribution across micro pick up array mount 828 is uniform.

After contact between the array of electrostatic transfer heads 203 and the micro devices is made, a voltage may be applied to the array of electrostatic transfer heads 203 to create a grip pressure on the array of micro devices. An electrostatic voltage may be applied to electrostatic transfer heads 203 through various contacts and connectors, e.g., operating voltage leads, operating voltage traces, operating voltage vias, etc. Such electrical contacts and connectors may be integrated within remote center robot 500 components and powered by voltage supplies based on control signals from computer 108. For example, computer 108 may implement a control algorithm instructing that electrostatic transfer heads 203 be activated if a predefined deformation is simultaneously sensed by each displacement sensor on micro pick up array mount 828 during a pick up process. As a result, the array of electrostatic transfer heads 203 may apply a gripping pressure to the array of micro devices after the entire array surface is in contact and uniform pressure is applied across the array.

After gripping the micro devices with electrostatic transfer heads 203, the micro devices may be picked up from carrier substrate. For example, z-flexure 508 and/or mass transfer tool 100 actuators may be controlled by computer 108 to retract micro pick up array 103 from the target substrate. During pick up, the electrostatic voltage supplied to the array of electrostatic transfer heads 203 may persist, and thus, the array of micro devices may be retained on the electrostatic transfer heads 203 and removed from the carrier substrate.

During the pick up operation, a heating element may direct heat toward micro pick up array mount 828 and/or micro pick up array 103. Thus, the micro devices may be heated through contact with electrostatic transfer heads 203 on micro pick up array 103 during pick up. For example, a heating element adjacent to micro pick up array mount 828 may be resistively heated to transfer heat to micro pick up array 103, and thus, to the micro devices through the electrostatic transfer heads 203. Heat transfer may occur before, during, and after picking up the array of micro devices from carrier substrate.

Although a pick up process is described in relation to FIG. 19, a similar methodology may be used to control the placement of micro devices onto a receiving substrate, such as a display substrate, held by receiving substrate holder 106. For example, as the micro devices are gripped by the array of electrostatic transfer heads 203, mass transfer tool 100 may move the receiving substrate under micro pick up array 103 using x-y stage 110. Accordingly, micro pick up array 103 may be aligned with a target region of the receiving substrate. Micro pick up array 103 may be advanced toward, and aligned with, the receiving substrate using the control sequence described above until the array of micro devices held by the array of electrostatic transfer heads 203 are placed in uniform contact with the target region. Uniform contact may be inferred by sensing a strain state of micro pick up array mount 828. Subsequently, voltage may be removed from the electrostatic transfer heads 203 to release the micro devices onto the receiving substrate and complete the transfer operation.

Figure 20:
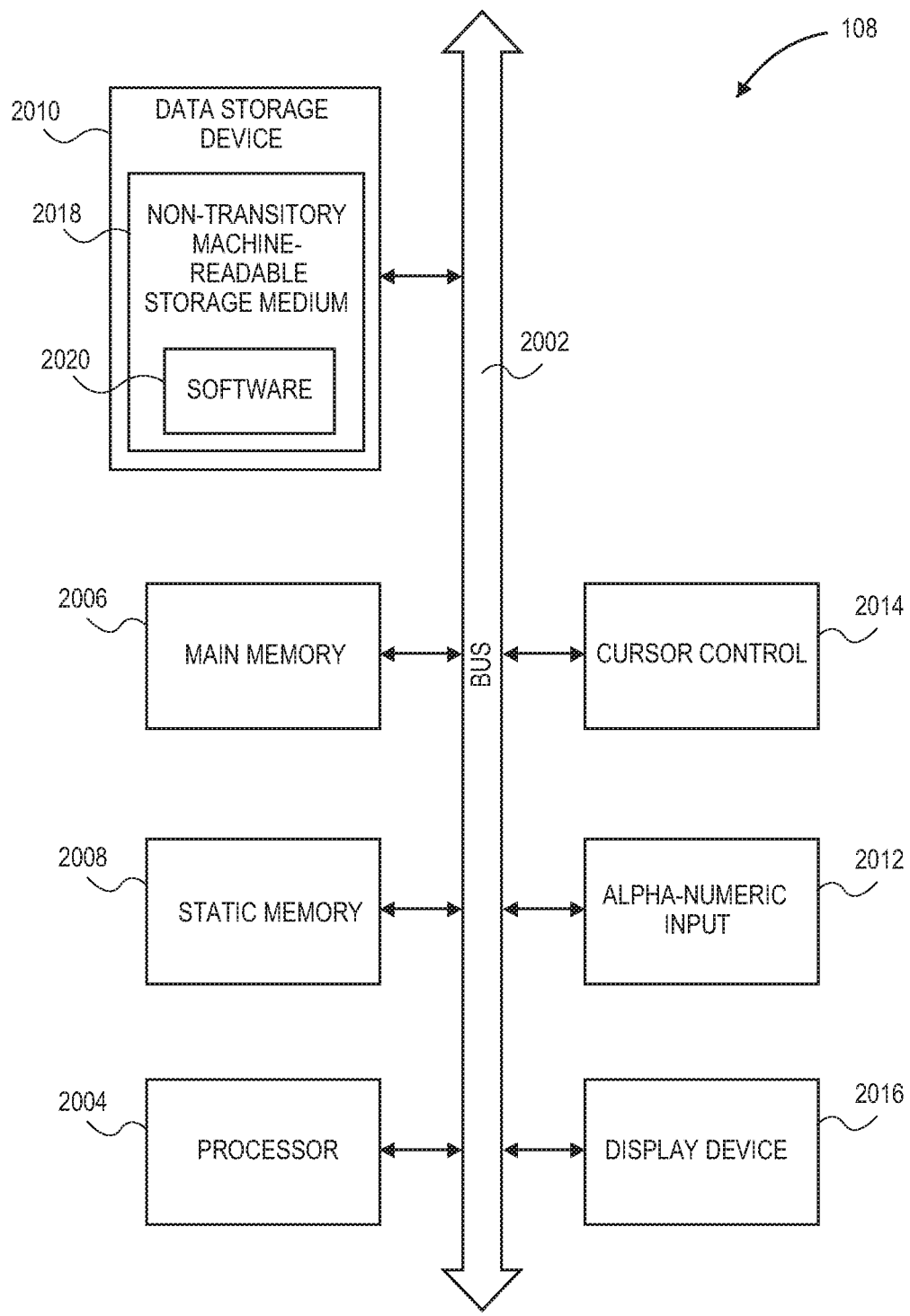
FIG. 20 is a schematic illustration of a computer system that may be used in accordance with an embodiment.

Referring to FIG. 20, a schematic illustration of a computer system is shown that may be used in accordance with an embodiment. Portions of embodiments of the invention are comprised of or controlled by non-transitory machine-readable and machine-executable instructions which reside, for example, in machine-usable media of a computer 108. Computer 108 is exemplary, and embodiments of the invention may operate on or within, or be controlled by a number of different computer systems including general purpose networked computer systems, embedded computer systems, routers, switches, server devices, client devices, various intermediate devices/nodes, stand-alone computer systems, and the like. Furthermore, although some components of a control system, e.g., signal conditioning and combination logic 1815 and dynamic control enable logic 1816, have been broken out for discussion separately above, computer 108 may integrate those components directly or include additional components that fulfill similar functions.

Computer 108 of FIG. 20 includes an address/data bus 2002 for communicating information, and a central processor 2004 coupled to bus 2002 for processing information and instructions. Computer 108 also includes data storage features such as a computer usable volatile memory, e.g. random access memory (RAM) 2006, coupled to bus 2002 for storing information and instructions for central processor 2004, computer usable non-volatile memory 2008, e.g. read only memory (ROM), coupled to bus 2002 for storing static information and instructions for the central processor 2004, and a data storage device 2010 (e.g., a magnetic or optical disk and disk drive) coupled to bus 2002 for storing information and instructions. Computer 108 of the present embodiment also includes an optional alphanumeric input device 2012 including alphanumeric and function keys coupled to bus 2002 for communicating information and command selections to central processor 2004. Computer 108 also optionally includes an optional cursor control 2014 device coupled to bus 2002 for communicating user input information and command selections to central processor 2004. Computer 108 of the present embodiment also includes an optional display device 2016 coupled to bus 2002 for displaying information.

The data storage device 2010 may include a non-transitory machine-readable storage medium 2018 on which is stored one or more sets of instructions (e.g. software 2020) embodying any one or more of the methodologies or operations described herein. For example, software 2020 may include instructions, which when executed by processor 2004, cause computer 108 to control mass transfer tool 100 or remote center robot 500 according to the control scheme described above for aligning a micro pick up array 103 with a target substrate. Software 2020 may also reside, completely or at least partially, within the volatile memory, non-volatile memory 2008, and/or within processor 2004 during execution thereof by computer 108, volatile memory 2006, non-volatile memory 2008, and processor 2004 also constituting non-transitory machine-readable storage media.

As used above, "coupling", "fastening", "joining", "retaining", etc., of one component against or with another may be accomplished using various well-known methods, such as bolting, pinning, clamping, thermal or adhesive bonding, etc. The use of such terms is not intended to be limiting, and indeed, it is contemplated that such methods may be interchangeable in alternative embodiments within the scope of the invention.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A remote center robot, comprising:
a first linkage having a first upper joint and a first lower joint separated along a first axis by a first link arm;
a second linkage mounted on the first linkage, the second linkage having a second upper joint and a second lower joint separated along a second axis by a second link arm, wherein the first axis and the second axis intersect at a remote rotational center on a z-axis;
wherein the first axis and the z-axis extend within a first plane, and wherein the second axis and the z-axis extend within a second plane, and wherein the first plane is offset from the second plane by an angle; and
a first linear actuator having a first end fixed relative to the first upper joint, wherein actuation of the first linear actuator changes a first angle between the first axis and the z-axis.

2. The remote center robot of claim 1, wherein the angle is an orthogonal angle.

3. The remote center robot of claim 1, further comprising a second linear actuator having a second end fixed relative to the second upper joint, wherein actuation of the second linear actuator changes a second angle between the second axis and the z-axis.

4. The remote center robot of claim 3, wherein the first axis intersects the z-axis at a remote tipping center, wherein the second axis intersects the z-axis at a remote tilting center, and wherein the remote tipping center is coincident with the remote tilting center at the remote rotational center.

5. The remote center robot of claim 1, wherein the first upper joint is coplanar with the second upper joint in an upper plane orthogonal to the z-axis, and wherein the first lower joint is coplanar with the second lower joint in a lower plane orthogonal to the z-axis.

6. The remote center robot of claim 5, wherein the first linkage includes a third upper joint and a third lower joint separated along a third axis, and a first coupler link between the third lower joint and the first lower joint, wherein the second linkage is mounted on the first coupler link.

7. The remote center robot of claim 6, wherein a third angle between the third axis and the z-axis is equal to a first angle between the first axis and the z-axis.

8. The remote center robot of claim 7, wherein the third upper joint is coplanar with the first upper joint in the upper plane.

9. The remote center robot of claim 1, wherein the first linkage further includes an adjustment joint above the first upper joint and an adjuster link between the first upper joint and an adjustment joint.

10. The remote center robot of claim 9, wherein the adjuster link is adjustable such that a first angle between the first axis and the z-axis changes when the adjuster link is adjusted.

11. The remote center robot of claim 10, wherein the adjuster link includes a variable length, and wherein the first angle changes when the variable length changes.

12. A remote center robot, comprising:
- a first linkage having a first upper joint and a first lower joint separated along a first axis by a first link arm;
- a second linkage mounted on the first linkage, the second linkage having a second upper joint and a second lower joint separated along a second axis by a second link arm, wherein the first axis and the second axis intersect at a remote rotational center on a z-axis;
- a z-flexure including an upper mount coupled with a bottom portion of the second linkage and a lower mount, such that the remote rotational center is below the lower mount;
- a distribution plate coupled with the lower mount of the z-flexure; and
- an insulator between the lower mount and the z-flexure.

13. The remote center robot of claim 12, further comprising a z-actuator within a central opening in the z-flexure.

14. The remote center robot of claim 13, wherein the z-flexure includes a linkage structure that moves under actuation from z-actuator.

15. The remote center robot of claim 14, wherein the linkage structure includes wedge links connected to the upper mount and the lower mount.

16. A remote center robot, comprising:
- a first linkage having a first upper joint and a first lower joint separated along a first axis by a first link arm; and
- a second linkage mounted on the first linkage, the second linkage having a second upper joint and a second lower joint separated along a second axis by a second link arm, wherein the first axis and the second axis intersect at a remote rotational center on a z-axis;
- wherein the first and second upper joints and the first and second lower joints include a plurality of living hinges;
- wherein a first combined stiffness of the first linkage is equal to a second combined stiffness of the second linkage.

* * * * *